(12) United States Patent
Kuroda et al.

(10) Patent No.: US 6,327,210 B1
(45) Date of Patent: Dec. 4, 2001

(54) SEMICONDUCTOR MEMORY DEVICE

(75) Inventors: Naoki Kuroda; Masashi Agata, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/711,884

(22) Filed: Nov. 15, 2000

(30) Foreign Application Priority Data

Nov. 16, 1999 (JP) .................................................. 11-324905

(51) Int. Cl.[7] .......................................................... G11C 8/00
(52) U.S. Cl. ............................................. 365/222; 365/233
(58) Field of Search .................................... 365/233, 222, 365/189.05

(56) References Cited

U.S. PATENT DOCUMENTS

| | | | |
|---|---|---|---|
| 5,673,233 | * | 9/1997 | Wright et al. .......................... 365/233 |
| 5,856,940 | * | 1/1999 | Rao ........................................ 365/149 |
| 6,028,804 | | 2/2000 | LEUNG ................................. 365/222 |
| 6,049,489 | * | 4/2000 | Merritt ............................. 365/189.05 |
| 6,154,417 | * | 11/2000 | Kim ...................................... 365/233 |
| 6,215,714 | * | 4/2001 | Takemae et al. ..................... 365/222 |
| 6,222,785 | * | 4/2001 | Leung ................................... 365/222 |

FOREIGN PATENT DOCUMENTS 9-190689    7/1997    (JP) .

* cited by examiner

*Primary Examiner*—Trong Phan
(74) *Attorney, Agent, or Firm*—McDermott, Will & Emery

(57) ABSTRACT

A semiconductor memory device allowing for high-speed random accesses and yet requiring no external refreshing by performing internal refreshing automatically and efficiently. If no external commands /RE or /WT, instructing that data should be read out or written on a memory cell, are given, the output signal of a first AND gate is asserted. A second AND gate is provided to obtain a logical product of the output signal of the first AND gate and an internal refresh signal INTREF representing that refreshing may be performed internally and independently. The output signal REFEN of the second AND gate is used as a reference signal for automatic refreshing. Thus, refreshing is performed automatically by taking advantage of a window during which no external commands are input. And when an external command is input, refreshing is canceled.

10 Claims, 21 Drawing Sheets

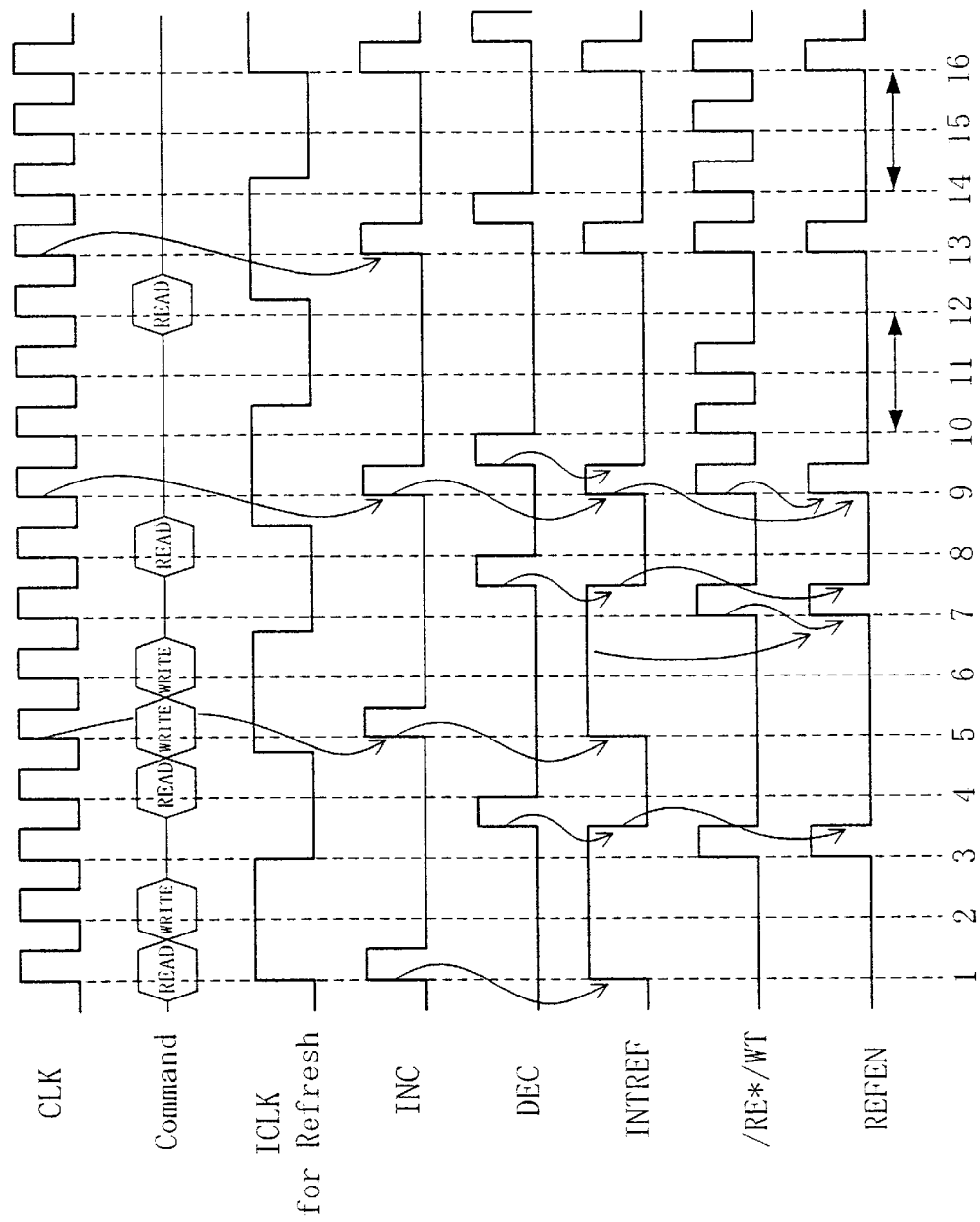

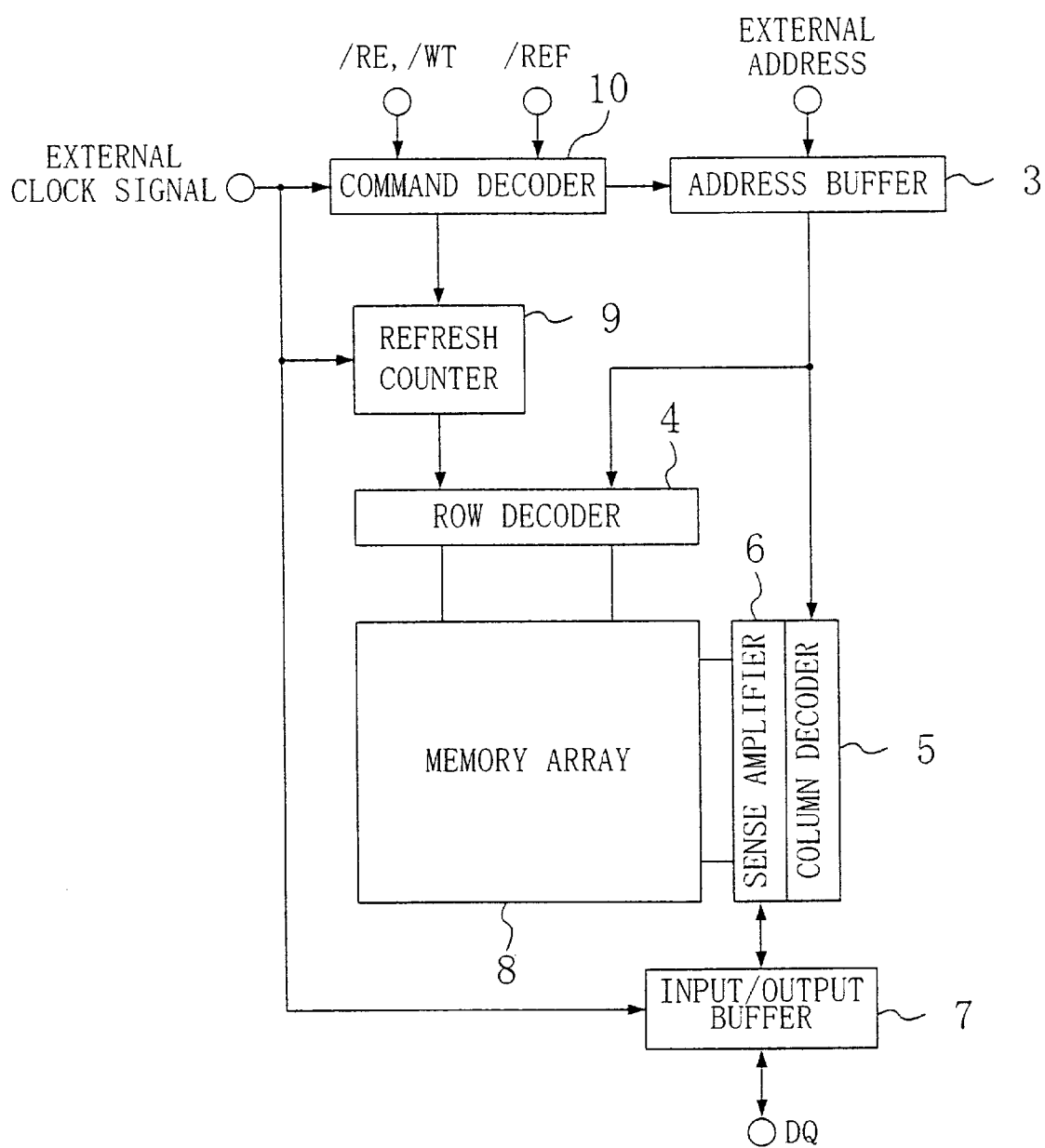

SEMICONDUCTOR MEMORY DEVICE

BACKGROUND OF THE INVENTION

The present invention relates to a semiconductor memory device like a dynamic random access memory (DRAM).

In a known semiconductor memory device, e.g., DRAM, in particular, data stored on its memory cell is usually lost due to its own physical properties after a certain period of time has passed. To avoid such an unfavorable situation, refreshing is needed. And to perform this refreshing a t regular intervals, a system utilizing a DRAM should control the refresh operation. Accordingly, a DRAM requiring refreshing is not so easy to handle as other semiconductor memory devices requiring no refreshing.

Hereinafter, a known semiconductor memory device will be described. FIG. 25 is a block diagram illustrating a configuration for a main part of a known semiconductor memory device. As shown in FIG. 25, the memory device includes address buffer 3, row decoder 4, column decoder 5, sense amplifier 6, input/output buffer 7, memory array 8, refresh counter 9 and command decoder 10. A set of addresses, consisting of row and column addresses, are externally input through the address buffer 3 and decoded by the row and column decoders 4 and 5, respectively. It should be noted that these column and row addresses externally input will be herein called an "external address" collectively. The sense amplifier 6 is provided to amplify the data stored on a memory cell. The input/output buffer 7 is provided to input and output data therethrough. In the memory array 8, a great number of memory cells, each requiring refreshing, are arranged in columns and rows. The refresh counter 9 is a collection of counters that are provided in such a number as needed to decode row addresses. The command decoder 10 decodes an externally input command to generate a refresh enable signal during refreshing. In response to the refresh enable signal, the refresh counter 9 counts the number of row addresses provided one by one.

The known semiconductor memory device with such a configuration performs refreshing responsive to a refresh command/REF that has been input to the device. On decoding the refresh command /REF, the command decoder 10 outputs the refresh enable signal to the refresh counter 9. In response, the refresh counter 9 starts counting the pulses of the refresh enable signal to find associated row addresses internally. And memory cells, which have been selected by the row decoder 4 by reference to the row addresses, are refreshed as a result. This operation should be performed a predetermined number of times within a predefined refresh cycle.

In the known configuration, however, the system outside of the DRAM should include a refresh controller to meet the requirements of refreshing. In addition, while the DRAM is performing the refresh operation, the system controls accesses to the DRAM so that the DRAM cannot be externally accessed. For these reasons, the DRAM is not so easy to handle as other semiconductor memory devices requiring no refreshing.

To cope with such a problem, a DRAM, which looks like requiring no refreshing, was proposed as disclosed in Japanese Laid-Open Publication No. 9-190689, in which two transistors are provided for a single memory cell and one of these two transistors is exclusively used for refreshing. A DRAM, including memory cells with such a two-transistor, one-capacitor construction, needs a chip area twice larger than a DRAM, including memory cells with a normal one-transistor, one-capacitor construction, does. Nevertheless, a DRAM of the former type still operates at the same frequency as a DRAM of the latter type. Thus, this alternative construction is not advantageous in cost effectiveness.

SUMMARY OF THE INVENTION

It is therefore an object of the present invention to provide a semiconductor memory device that allows for high-speed random accesses and yet needs no external refreshing or no refresh controllers built in its external system.

To achieve this object, a semiconductor memory device according to the present invention is so constructed as to start refreshing automatically unless external commands are input to the device.

An inventive semiconductor memory device includes: an array of memory cells; command detecting means for detecting input or no input of an external command that requests access to one of the memory cells; and refreshing means for performing a refresh operation on associated one of the memory cells if the detecting means has detected no input of the command.

In one embodiment of the present invention, the refreshing means cancels the refresh operation when the detecting means detects the input of the command.

In another embodiment of the present invention, two transistors are connected to each said memory cell in the memory array.

In this particular embodiment, each of the two transistors in the memory cell is used for accessing and refreshing purposes.

In still another embodiment, the memory cell is accessed synchronously with an external clock signal, and the refreshing means performs the refresh operation synchronously with the external clock signal.

In this particular embodiment, if a frequency of the external clock signal is higher than a frequency corresponding to a refresh cycle time, the refreshing means performs the refresh operation synchronously with the external clock signal.

Alternatively, if a frequency of the external clock signal is equal to or lower than a frequency corresponding to a refresh cycle time, the refreshing means generates a refresh clock signal with a frequency higher than the frequency of the external clock signal and performs the refresh operation synchronously with a logical product of the refresh clock signal and the external clock signal.

As another alternative, if a frequency of the external clock signal is higher than a frequency corresponding to a refresh cycle time and if the command has not been input externally for a predetermined period of time or more, the refreshing means generates a refresh clock signal with a frequency lower than the frequency of the external clock signal and performs the refresh operation synchronously with a logical product of the refresh clock signal and the external clock signal.

In still another embodiment, two transistors are provided for each said memory cell in the memory array and two signal propagation paths are provided for the array. Each said line is provided with an address latch. The refreshing means includes a comparator for comparing a refresh address, which has been latched in one of the address latches during the refresh operation, to an external address, which was latched in the other address latch just before the refresh operation. If the refresh address matches to the external address, then the refreshing means cancels the refresh operation on one of the memory cells that is specified by the refresh address.

In yet another embodiment, the refreshing means includes: an address latch for latching an external address that is input externally during a normal operation in which one of the memory cells is accessed; and a comparator for comparing a refresh address, which has been input during the refresh operation, to the external address that was latched in the address latch just before the refresh operation. If the refresh address matches to the external address, then the refreshing means cancels the refresh operation on one of the memory cells that is specified by the refresh address.

In this particular embodiment, the device further includes at least one additional address latch and at least one additional comparator that perform the same functions as the address latch and the comparator, respectively. The refresh address is compared to the external address latched in each said address latch during the refresh operation.

In still another embodiment, if the refresh address matches to the external address latched in the address latch, the refreshing means updates the refresh address.

In yet another embodiment, the refreshing means includes a comparator for comparing an external address to a refresh address during a normal operation in which one of the memory cells is accessed. If the refresh address matches to the external address, the refreshing means updates the refresh address.

In yet another embodiment, the device further includes means for restricting the refresh operation that is performed by the refreshing means when no input of the command is detected.

In this particular embodiment, the restricting means independently asserts an internal refresh signal indicating that the refresh operation is enabled. If the detecting means has detected no input of the command and if the internal refresh signal is being asserted, the restricting means gets the refresh operation started.

More particularly, if the detecting means has detected the input of the command or if the internal refresh signal is being negated, the restricting means gets the refresh operation canceled.

In yet another embodiment, if the refresh operations have been performed a required number of times, which number corresponds to a total number of the memory cells, within a refresh cycle time required to refresh all of these memory cells, then the restricting means prohibits the refresh operation until a next refresh cycle begins.

In yet another embodiment, the internal refresh signal is asserted by the restricting means when a refresh timer is set. The refresh timer keeps the refresh cycle time needed to refresh all of the memory cells. The internal refresh signal is negated by the restricting means when a refresh counter resets itself back to a count of zero. The refresh counter counts the number of times that the refresh operations have been performed.

In yet another embodiment, the restricting means includes a refresh timer that generates a refresh clock signal. Once the refreshing means has completed the refresh operation within one cycle of the refresh clock signal, the restricting means prohibits the refresh operation in remaining time of the cycle.

In an alternative embodiment, the restricting means includes: a refresh timer that generates a refresh clock signal; and a counter. The counter is incremented based on a result of an AND operation performed on the refresh clock signal and an external clock signal, and is decremented when the refresh operation is started. If the count of the counter is one or more, the internal refresh signal is asserted. And if the count of the counter is zero, the internal refresh signal is negated.

In another alternative embodiment, the restricting means includes: a refresh timer that generates a refresh clock signal; and two counters. One of the counters counts the number of pulses of the refresh clock signal that have been applied, while the other counter counts the number of times the refresh operations have been performed. If the counts of the two counters are different from each other, the internal refresh signal is asserted. When the counts of the two counters get equal to each other, the internal refresh signal is negated and the counters are reset.

In still another embodiment, the refreshing means includes: a refresh timer for keeping a preset refresh cycle time; and means for setting the refresh timer by detecting no input of the external command.

In yet another embodiment, the refreshing means includes: a refresh counter for counting the number of times the refresh operations have been performed until the count of the counter reaches a required number of times; a refresh timer for keeping a preset refresh cycle time; and means for resetting the refresh timer if the refresh timer has already recorded one cycle time before the count of the refresh counter reaches the required number of times.

In yet another embodiment, the refreshing means includes: a refresh counter for counting the number of times the refresh operations have been performed until the count of the counter reaches a required number of times; a refresh timer for keeping a preset refresh cycle time; and means for changing the cycle time of the refresh timer if the refresh timer has already recorded one cycle time before the count of the refresh counter reaches the required number of times.

According to the present invention, the refresh operations are performed on memory cells by taking advantage of a period of time in which none of the memory cells is accessed externally (which period will be herein called a "window"). Thus, the system does not have to be in charge of the refresh operations. That is to say, no refresh controller is needed outside of the memory device. Accordingly, the DRAM of the present invention is almost as easy to handle as an SRAM.

In addition, according to the present invention, if a memory cell is accessed synchronously with an external clock signal, the refresh operation is also performed synchronously with the same external clock signal. Thus, no complicated timing control is needed anymore to time memory access with refreshing. Furthermore, the refresh cycle time is changeable depending on the frequency of the external clock signal or how often commands are input per unit time. Accordingly, even if the frequency of the external clock signal is relatively low, the refresh requirements still can be met. Or if no memory cells are accessed for a rather long time, then the refresh cycle can be extended. As a result, the power dissipation can be cut down.

Furthermore, according to the present invention, a refresh address specified for a refresh operation is compared to the address of a memory cell that has been accessed just before the refresh operation. If the refresh address matches to the latter address, then the refresh operation on the memory cell specified by this refresh address is canceled. That is to say, the address of such a just-accessed memory cell, on/from which data has just been written or read, may be regarded as the address of a memory cell that has already been refreshed.

In this manner, the refresh operations need to be performed a reduced number of times and the overall power dissipation can be cut down. Also, if multiple address latches are provided to latch the address of every accessed memory cell (i.e., on/from which data has been written or read), then those addresses will match to each other with much higher certainty, thus further reducing the power dissipation.

Moreover, according to the present invention, once the refresh operations have been performed a required number of times, the refresh operations will not be repeated anymore for nothing even if there is extra time left before the processing result is passed to the system. Thus, unnecessary refresh current can be saved and the current consumed can be cut down effectively.

Furthermore, according to the present invention, after the device has been powered, the refresh timer is not set until an external command is input for the first time. That is to say, the refresh timer does not operate so long as no data refreshing is needed. Thus, the power can also be saved.

Moreover, according to the present invention, even if the refresh cycle time of a refresh timer built in any chip has become shorter than a preset refresh cycle time due to process-induced variations, the refresh operation still can be performed in the preset refresh cycle time.

BRIEF DESCRIPTION OF THE DRAWINGS

FIG. 24 is a timing diagram illustrating how the memory device of the eleventh embodiment operates.

FIG. 25 is a block diagram illustrating a configuration for a main part of a known semiconductor memory device.

DESCRIPTION OF THE PREFERRED EMBODIMENTS

Hereinafter, preferred embodiments of the present invention will be described with reference to the accompanying drawings.

Figure 2:
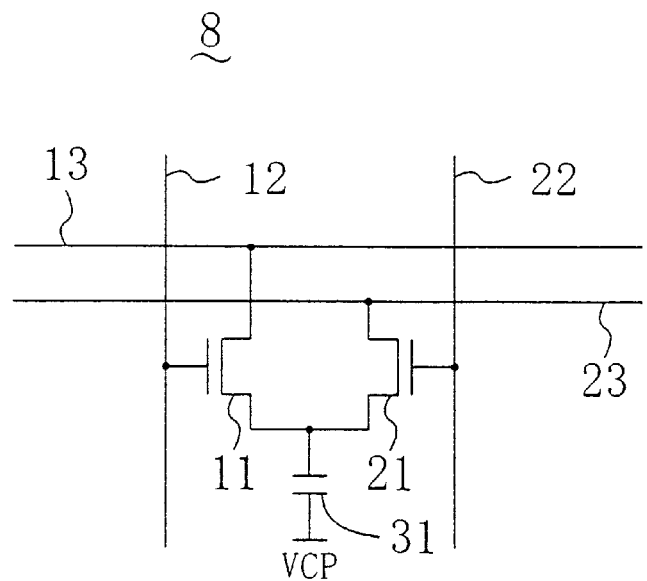
FIG. 2 illustrates an exemplary internal configuration for the memory array of the memory device shown in FIG. 1.

The present invention is applicable particularly effectively to a semiconductor memory device that can equalize a cycle time and an access time with each other. Thus, in the following illustrative embodiments, the present invention will be described as being applied to a semiconductor memory device of that type, i.e., a device including a memory cell consisting of two transistors and one capacitor as shown in FIG. 2.

EMBODIMENT 1

Figure 1:
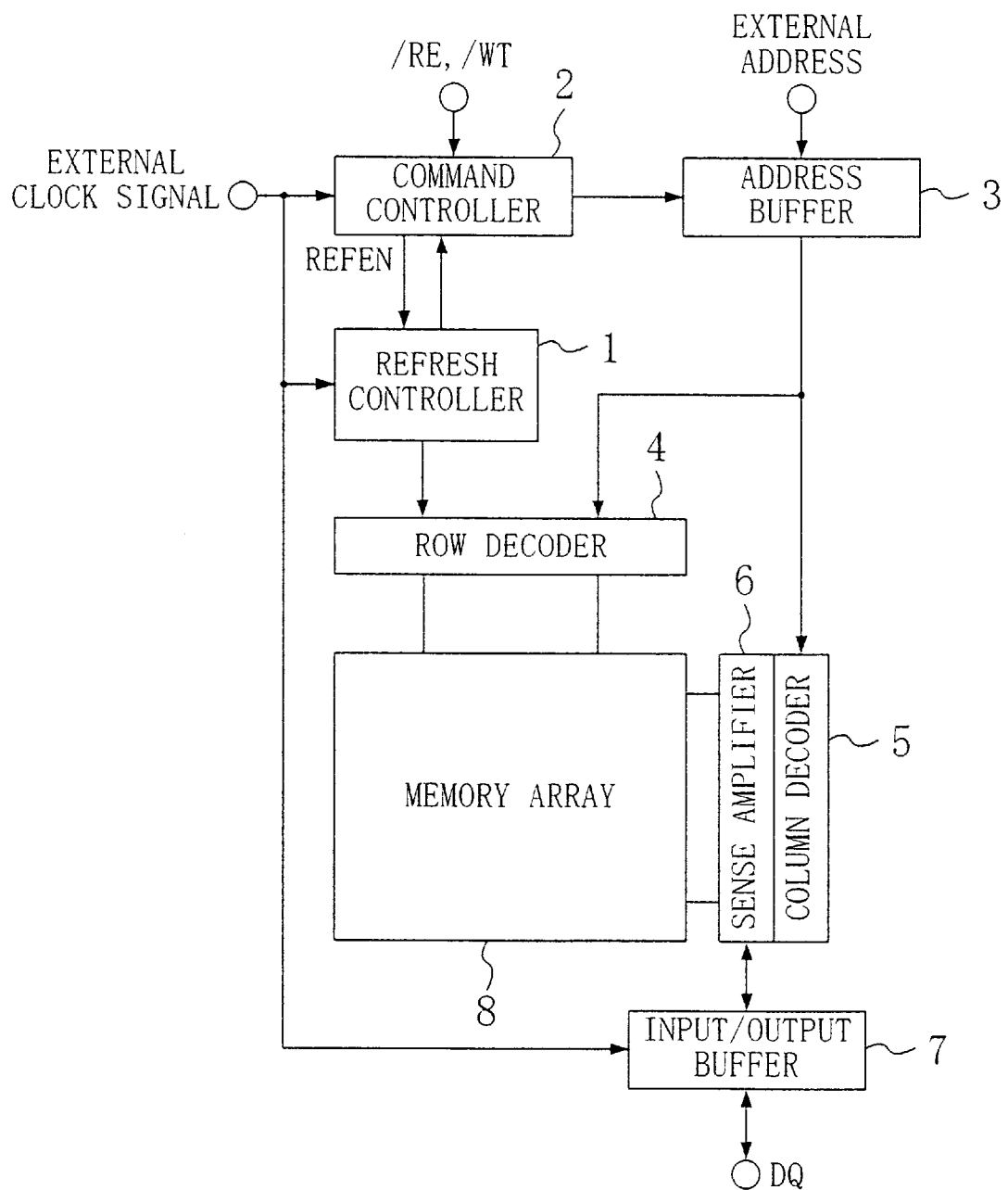
FIG. 1 is a block diagram illustrating a configuration for a main part of a semiconductor memory device according to a first embodiment of the present invention.

FIG. 1 is a block diagram illustrating a configuration for a main part of a semiconductor memory device according to a first embodiment of the present invention.

Figure 3:
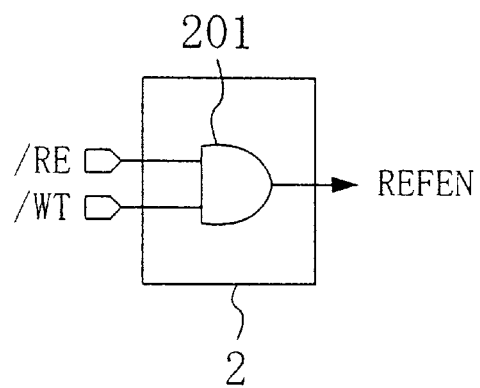
FIG. 3 illustrates an exemplary internal configuration for the command controller of the memory device shown in FIG. 1.

The memory device illustrated in FIG. 1 operates synchronously with an external clock signal. As shown in FIG. 1, the device includes a refresh controller 1 and a command controller 2, which are exemplary refreshing means and exemplary command detecting means, respectively, as defined in the appended claims. The refresh controller 1 performs control over a refresh operation to be carried out inside the device. The command controller 2 decodes an externally input command (e.g., a read or write instruction /RE or /WT) to generate a refresh enable signal REFEN and includes an AND gate 201 as shown in FIG. 3. The AND gate 201 is activated while no external commands (i.e., neither /RE nor /WT) are input to read or write data (e.g., while an NOP command is being input).

As shown in FIG. 1, the memory device further includes address buffer 3, row decoder 4, column decoder 5, sense amplifier 6, input/output buffer 7 and memory array 8. A set of addresses, consisting of row and column addresses, is externally input (which will be herein called an "external address" collectively) through the address buffer 3, latched in the buffer 3 and then decoded by the row and column decoders 4 and 5, respectively. The sense amplifier 6 is provided to amplify the data stored on a memory cell. The input/output buffer 7 is provided to input or output data therethrough. In the memory array 8, a number of memory cells, each requiring refreshing, are arranged in columns and rows.

FIG. 2 illustrates a part of the memory array 8. As shown in FIG. 2, two memory transistors 11 and 12 are provided for a single memory cell 31 and are controllable independent of each other. Two word lines 12 and 22 are connected to the transistors 11 and 12, respectively, to control these transistors 11 and 12 independently. Two bit lines 13 and 23 are further connected to the transistors 11 and 12, respectively, to read or write data from/onto the single memory cell 31 through two different paths. That is to say, the memory array 8 partially shown in FIG. 2 has two independent signal propagation paths, i.e., a path including the word and bit lines 12 and 13 and a path including the word and bit lines 22 and 23.

Responsive to the refresh enable signal REFEN output from the command controller 2, the refresh controller 1 shown in FIG. 1 is activated and outputs the row address of memory cells to be refreshed to the row decoder 4.

Hereinafter, it will be described with reference to FIG. 5 how the memory device with such a configuration performs refresh operations.

The memory device including the memory array 8 shown in FIG. 2 has two different signal propagation paths for a single memory cell. Thus, through each of these two paths, the bit line is precharged in the first half of one cycle and data is read or written in the second half of the cycle. In this case, however, while data is being read or written through one of these two paths, the bit line can be precharged through the other path. In this manner, the access time can be equalized with the cycle time. Thus, an external command READ or WRITE can be input every time one cycle of the external clock signal CLK terminates. Accordingly, a semiconductor memory device like this can perform the refresh operations efficiently while no reading or writing is needed.

Figure 5:
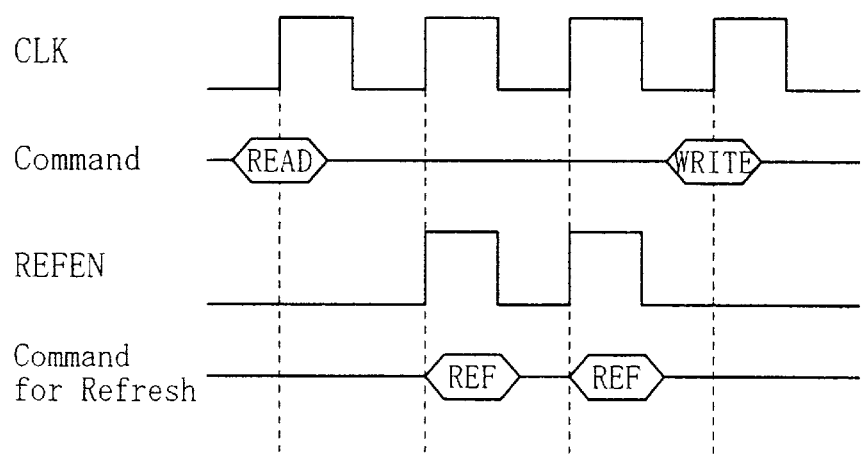
FIG. 5 is a timing diagram illustrating how the memory device of the first embodiment operates.

As shown in FIG. 5, responsive to an external command READ that has been input synchronously with the leading edge of the first pulse of the external clock signal CLK, a normal read operation is performed. In this case, first, the command controller 2 issues a READ instruction to the address buffer 3. In response, the row and column addresses included in the external address, which has been input to the address buffer 3, are input to the row and column decoders 4 and 5, respectively. In this manner, a word line and a bit line (e.g., the word line 12 and the bit line 13) which are associated with the column and row addresses, are selected. Next, data is read out from an associated memory cell in the memory array 8 and then amplified by the sense amplifier 6. Thereafter, the amplified data is passed through a data bus to the input/output buffer 7 and then output synchronously with the leading edge of the second pulse of the external clock signal CLK. In parallel with this read operation, the data is re-stored on the memory cell and the bit line is precharged.

Next, on the leading edge of the second pulse of the external clock signal CLK, no external commands are input. In this case, the refresh enable signal REFEN, which enables the execution of the refresh operations, is asserted by the AND gate 201 in the command controller 2 shown in FIG. 3. Responsive to this refresh enable signal REFEN, the refresh controller 1 is activated and outputs the row address of memory cells to be refreshed. The row decoder 4 decodes the row address to select associated memory cells in the memory array 8. Then, the data that has been stored on those selected memory cells is read out onto the other bit line (e.g., the bit line 23) and amplified by the sense amplifier 6. Since the refresh operation is being carried out, the data is not passed to the input/output buffer 7. However, as in the read operation, the data is also re-stored on the memory cells and the bit line is also precharged.

No external commands are input either at the leading edge of the third pulse of the external clock signal CLK. Thus, associated memory cells are refreshed using the port connected to the bit line 13 this time.

Finally, synchronously with the leading edge of the fourth pulse of the external clock signal CLK, another external command WRITE is input. In response, the refresh enable signal REFEN is negated. As a result, the refresh operations are canceled and a normal write operation is performed instead.

In this embodiment, the refresh operations are performed by sensing a window during which no external commands are input. Thus, the system does not have to wait for a refresh command to come as an external command. In other words, there is no need for the system to include any circuit for controlling the refresh operations. Accordingly, the memory device of this embodiment can be almost as easy to handle as a semiconductor memory device requiring no refreshing, e.g., a static random access memory (SRAM).

Furthermore, since the refresh operations can be started or canceled without interfering with random accesses, high-speed accesses are realized. For example, as for a 16 Mbit DRAM, the refresh cycles should be iterated 2048 times per 32 ms. Accordingly, supposing the cycle time is 100 ns, just 0.64% of one refresh cycle time should be allotted to the refresh operation. In this manner, by sparing only less than 1% of the overall effective access time, a semiconductor memory device, which is almost as easy to handle as an SRAM and yet can operate at high speeds, is realized with a reduced cost.

In the first embodiment, a semiconductor memory device operating synchronously with an external clock signal has been described. Naturally, though, the present invention is applicable to a non-synchronous semiconductor memory device, too. Also, in the foregoing embodiment, the AND gate 201 for obtaining a logical product of the external commands /RE and /WT is used as a circuit for sensing a window in which the system supplies no external commands. Alternatively, any other logic circuit may also be used so long as the circuit can sense no input of external commands.

Furthermore, in the memory array 8 of the first embodiment, the two transistors 11 and 21 are connected to the single memory cell 31 as shown in FIG. 2. However, the present invention is naturally applicable to a normal construction in which one transistor is connected to one memory cell.

EMBODIMENT 2

Hereinafter, a second embodiment of the present invention will be described. In this embodiment, where refreshing is started synchronously with the external clock signal in the window during which no external commands are input, the refreshing is performed for an appropriate period of time no matter whether a prescribed refresh frequency is higher or lower than the operating frequency.

Figure 4:
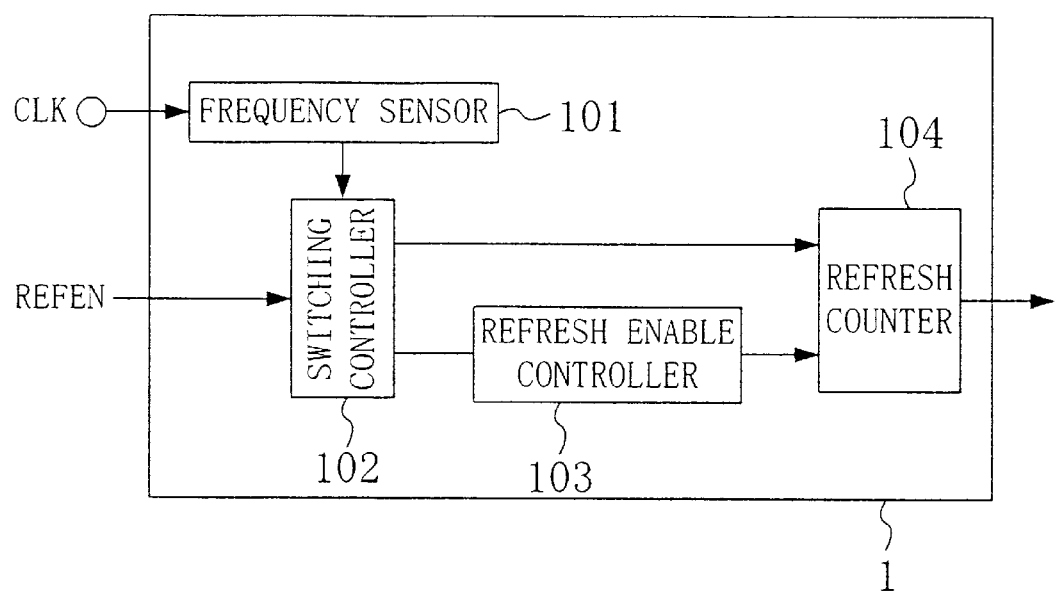
FIG. 4 is a block diagram illustrating a configuration for a main part of a semiconductor memory device according to a second embodiment of the present invention.
Figure 6:
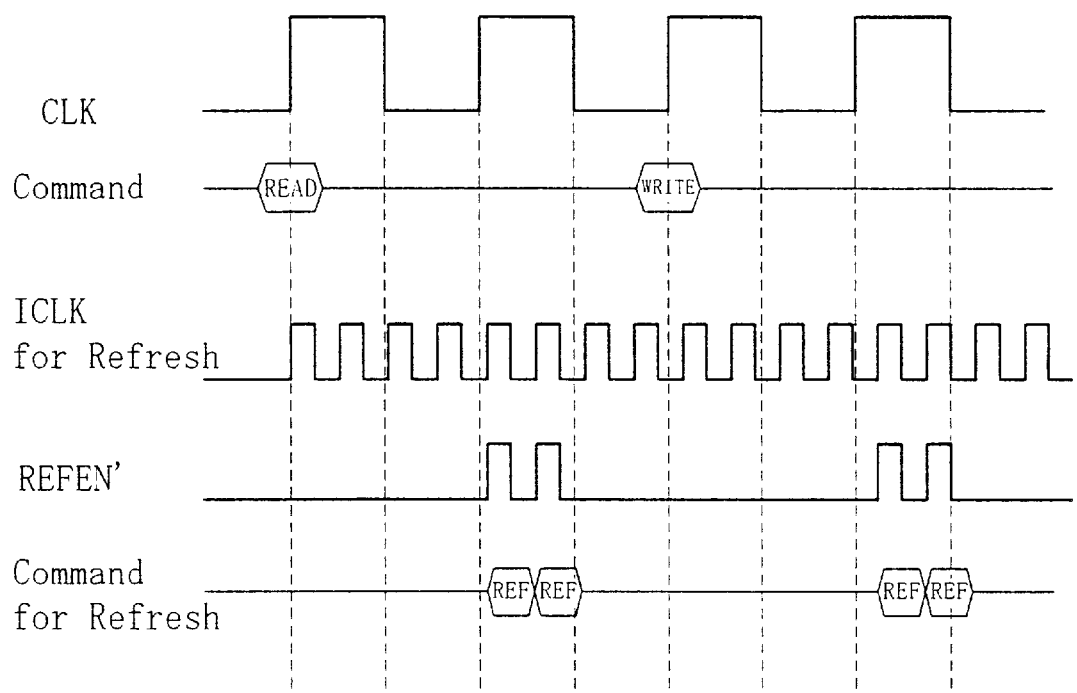
FIG. 6 is a timing diagram illustrating how the memory device of the second embodiment operates.

FIG. 4 is a block diagram illustrating a configuration for a main part of a semiconductor memory device according to a second embodiment of the present invention. As shown in FIG. 4, the device includes frequency sensor 101, switching controller 102, refresh enable controller 103 and refresh counter 104. The frequency sensor 101 senses the frequency of the external clock signal CLK. The switching controller 102 receives the output of the frequency sensor 101 and the refresh enable signal REFEN that has been output from the command controller 2. If the output of the frequency sensor 101 indicates that the frequency of the external clock signal CLK is higher than the prescribed refresh frequency, then the switching controller 102 outputs the refresh enable signal REFEN, which has been received from the command controller 2, to the refresh counter 104. In response, the counter 104 counts how many times the counter 104 has received pulses of the refresh enable signal REFEN. On the other hand, if the frequency of the external clock signal CLK is lower than the prescribed refresh frequency, then the switching controller 102 outputs the refresh enable signal REFEN to the refresh enable controller 103. The controller 103 generates, by itself, a refresh clock signal ICLK for Refresh that meets the requirements of refreshing as shown in FIG. 6. In the example illustrated in FIG. 6, the frequency of the refresh clock signal ICLK for Refresh is twice higher than that of the external clock signal CLK. And responsive to the refresh enable signal REFEN from the switching controller 102, the refresh enable controller 103 obtains a logical product of the refresh clock signal ICLK for Refresh and the external clock signal CLK at that time. In this manner, the controller 103 asserts the refresh clock signal ICLK for Refresh only while the external clock signal CLK is being asserted. As shown in FIG. 6, the asserted part of the refresh clock signal ICLK for Refresh is an internally generated refresh enable signal REFEN'.

Hereinafter, it will be described with reference to FIGS. 5 and 6 how the memory device with such a configuration performs the refresh operations.

The memory device, operating synchronously with the external clock signal CLK, automatically starts and cancels its internal refresh operations synchronously with the external clock signal CLK as shown in FIG. 6. As described above, the frequency sensor 101 senses the frequency of the external clock signal CLK (i.e., the operating frequency of the device in this case). If the operating frequency is higher than a prescribed refresh frequency, then the switching controller 102 passes the refresh enable signal REFEN, which has been generated by the command controller 2, to the refresh counter 104 as it is. As a result, refreshing is performed once a cycle of the external clock signal CLK as shown in FIG. 5.

Alternatively, if the operating frequency is lower than the prescribed refresh frequency, then the switching controller 102 outputs the refresh enable signal REFEN, generated in the command controller 2, to the refresh enable controller 103. In response, the controller 103 generates the refresh enable signal REFEN' at the prescribed refresh frequency. In the example illustrated in FIG. 6, the controller 103 generates two pulses of the refresh enable signal REFEN' for one cycle time of the external clock signal CLK. Then, the controller 103 outputs the refresh enable signal REFEN' to the refresh counter 104. Accordingly, even if the operating frequency is lower than the prescribed refresh frequency, the refresh operations still can be performed iteratively at the prescribed refresh frequency.

Thus, according to this embodiment, the refresh operations are supposed to be synchronous with the external clock signal CLK. Accordingly, there is no need to time the input of external commands and the start of the internal refresh operations and no timing sensor is need, either. As a result, the required chip area can be reduced. Also, the additional clock signal ICLK for Refresh is generated internally, and the refresh operations can be performed at a high frequency even if the operating frequency is low. Thus, it is possible to avoid a situation where the requirements of refreshing cannot be met due to a low operating frequency.

In this embodiment, if the operating frequency is low, pulses of the refresh clock signal ICLK for Refresh are supplied as the alternative refresh enable signal REFEN' while the external clock signal CLK is logically high. However, the present invention is not limited to such a specific embodiment. Optionally, the refresh operations may also be performed additionally in other intervals during which the input of external commands does not overlap with the normal refresh operations.

Also, in the second embodiment, if the operating frequency is high, the refresh operation is supposed to be performed once a cycle of the external clock signal CLK. Alternatively, to further cut down on the current consumed, one refresh cycle time may be extended by dividing the frequency of the external clock signal CLK by two or four, for example.

Furthermore, the second embodiment may be modified in the following manner. For example, a circuit for sensing no input of external commands for a certain period of time may be provided inside the frequency sensor 101 shown in FIG. 4 so that the switching controller 102 can select the refresh enable controller 103 automatically if no external commands have been input for the period. In that case, if the operating frequency is lower than the prescribed refresh frequency, the refresh enable controller 103 performs the control in the above-described manner. On the other hand, if the operating frequency is higher than the prescribed refresh frequency, then the refresh enable signal REFEN' should be generated internally every time the external clock signal CLK rises while the refresh clock signal ICLK for Refresh is high. In this manner, pulses of the refresh enable signal REFEN' can be generated an appropriate number of times. Thus, if the refresh cycle time is changed by detecting no input of external commands for a certain period of time, the number of times of refreshing can be reduced even when the operating frequency is that high while the chip is in standby state for a long time. As a result, the current consumed can be reduced sufficiently. Furthermore, even if refreshing should be started in the standby state where no external commands have been input for a certain period of time, the refreshing can also be started automatically and repeated a few required times without giving no special external commands to the device.

EMBODIMENT 3

Hereinafter, a third embodiment of the present invention will be described. In the third embodiment, the refresh operations are also performed by taking advantage of the window in which no external commands are input. The third embodiment also relates to a technique of reducing the number of times of refreshing to less than a normally required number.

Figure 7:
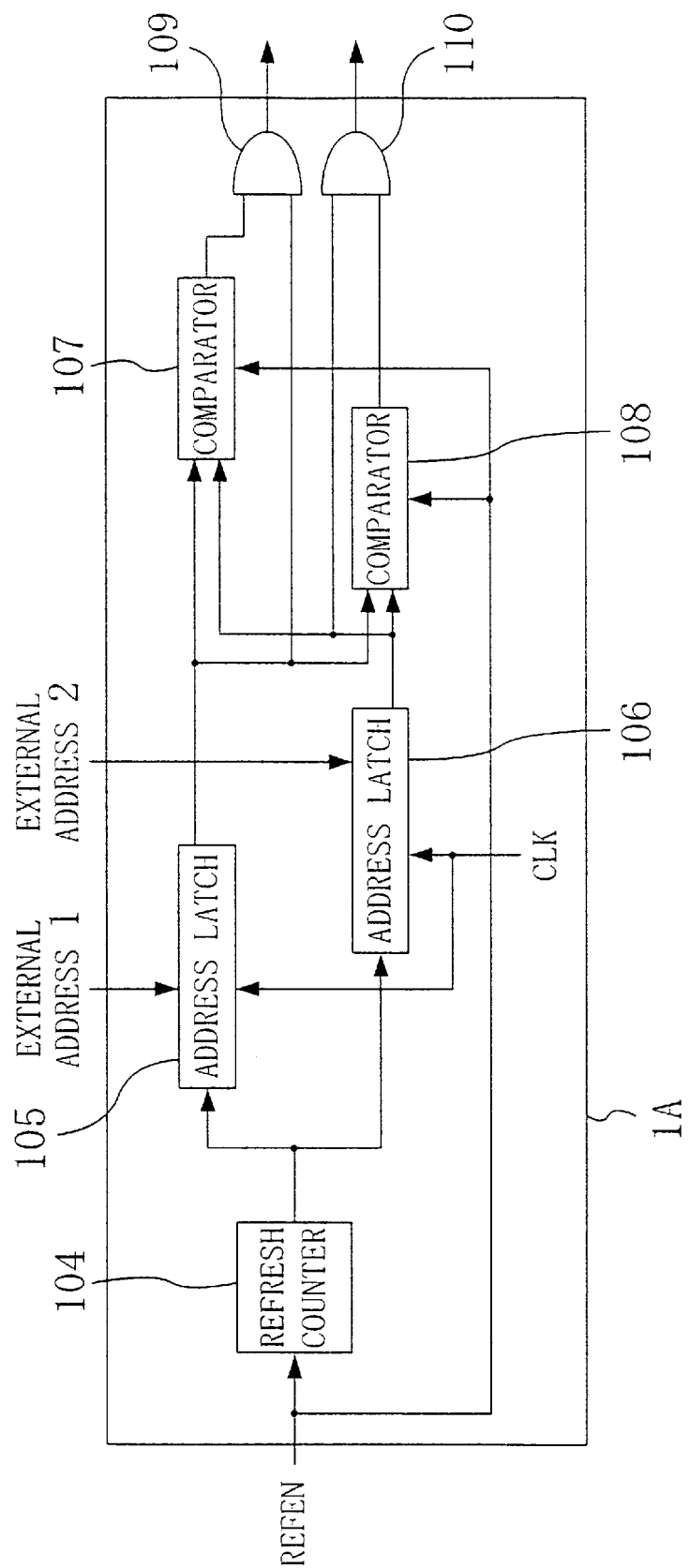
FIG. 7 is a block diagram illustrating a configuration for a main part of a semiconductor memory device according to a third embodiment of the present invention.

FIG. 7 illustrates the third embodiment of the present invention. The main part of the memory device of the third embodiment is almost the same as that illustrated in FIG. 1 except that the refresh controller 1 shown in FIG. 1 is replaced with the refresh controller 1A shown in FIG. 7. As shown in FIG. 7, the refresh controller 1A includes refresh counter 104, address latches 105 and 106, comparators 107 and 108 and AND gates 109 and 110. Each of the address latches 105 and 106 latches an external address or a refresh address during normal and refresh operations. Each of the comparators 107 and 108 compares the addresses latched in the address latches 105 and 106 to each other during refreshing. And in accordance with the information representing the results of comparison performed by the comparators 107 and 108, each of the AND gates 109 and 110 sends out a signal to the row decoder 104 shown in FIG. 1. In this embodiment, the two address latches 105 and 106, two comparators 107 and 108 and two AND gates 109 and 110 are provided, because each memory cell 31 has two transistors 11 and 21 as described for the first embodiment by reference to FIG. 2.

Figure 8:
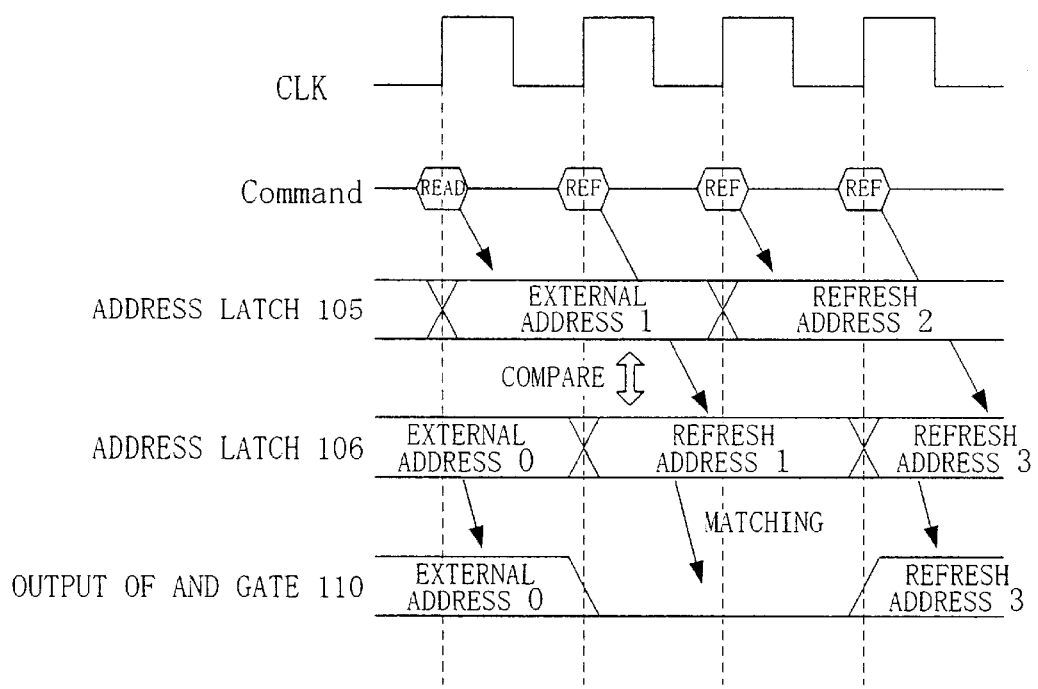
FIG. 8 is a timing diagram illustrating how the memory device of the third embodiment operates.

Hereinafter, it will be described with reference to the timing diagram illustrated in FIG. 8 how the memory device with such a configuration performs control over its refresh operations.

When a refresh operation is started, the command controller 2 generates the refresh enable signal REFEN. And the refresh counter 104 counts the number of times pulses of the refresh enable signal REFEN have been generated. In response, a refresh address, which has been output from the refresh counter 104, is latched in one of the two latches (e.g., the latch 106). In the meantime, the other address latch 105 has latched therein an external address that has been input synchronously with the previous pulse of the external clock signal CLK.

Thereafter, the external address latched in the address latch 105 and the refresh address latched in the address latch 106 are input to the comparator 108. The comparator 108, which has already been activated responsive to the refresh enable signal REFEN, compares these two input addresses to each other. If these two addresses match to each other, i.e., if the refresh address is the same as the external address that has been input synchronously with the previous pulse of the external clock signal CLK, then the comparator 108 outputs a low-level signal to deactivate the AND gate 110. As a result, refreshing, which would otherwise be performed on a memory cell specified by the external address that has been input synchronously with the previous pulse of the external clock signal CLK (i.e., a memory cell on/from which data has just been written or read), is canceled. On the other hand, if the two addresses are different from each other, then the comparator 108 outputs a high-level signal. Then, the refresh address, which has been output from the address latch 106, is passed to the row decoder 4, thereby performing the refresh operation on the memory cells specified by the refresh address.

After the refresh operation has been performed in this way, a next refresh address is latched in the other address latch 105 this time and the refresh addresses are compared to each other by the comparator 107 as in the previous cycle. However, this new refresh address cannot be equal to the previous refresh address latched in the address latch 106. Accordingly, the new refresh address is passed to the row decoder 4 by way of the AND gate 109 and the refresh operation is performed in a similar manner.

As can be seen, if a given refresh address for refreshing is found matching to a previously input external address, then a previously accessed memory cell, specified by that external address, does not have to be refreshed. Thus, the refresh operation can be omitted once in that situation and eventually the refresh operations can be performed less than a normally required number of times. Also, since the address latches 105 and 106 can be used for both the normal and refresh operations as they are, a chip area occupied by the device can be smaller. Moreover, by combining the second and third embodiments together, the efficiency of refreshing can be further increased.

In this embodiment, even if the refresh operations should be performed consecutively, the comparators 107 and 108 always compare the addresses. Alternatively, in that case, if it is found that the refresh operations have been performed twice or more, the comparators 107 and 108 may be deactivated so that the addresses are output to the row decoder 4 without being compared as in the normal operation.

EMBODIMENT 4

Hereinafter, a fourth embodiment of the present invention will be described. Like the third embodiment, the fourth embodiment also relates to a technique of reducing the number of times of refreshing to less than a normally required number.

Figure 9:
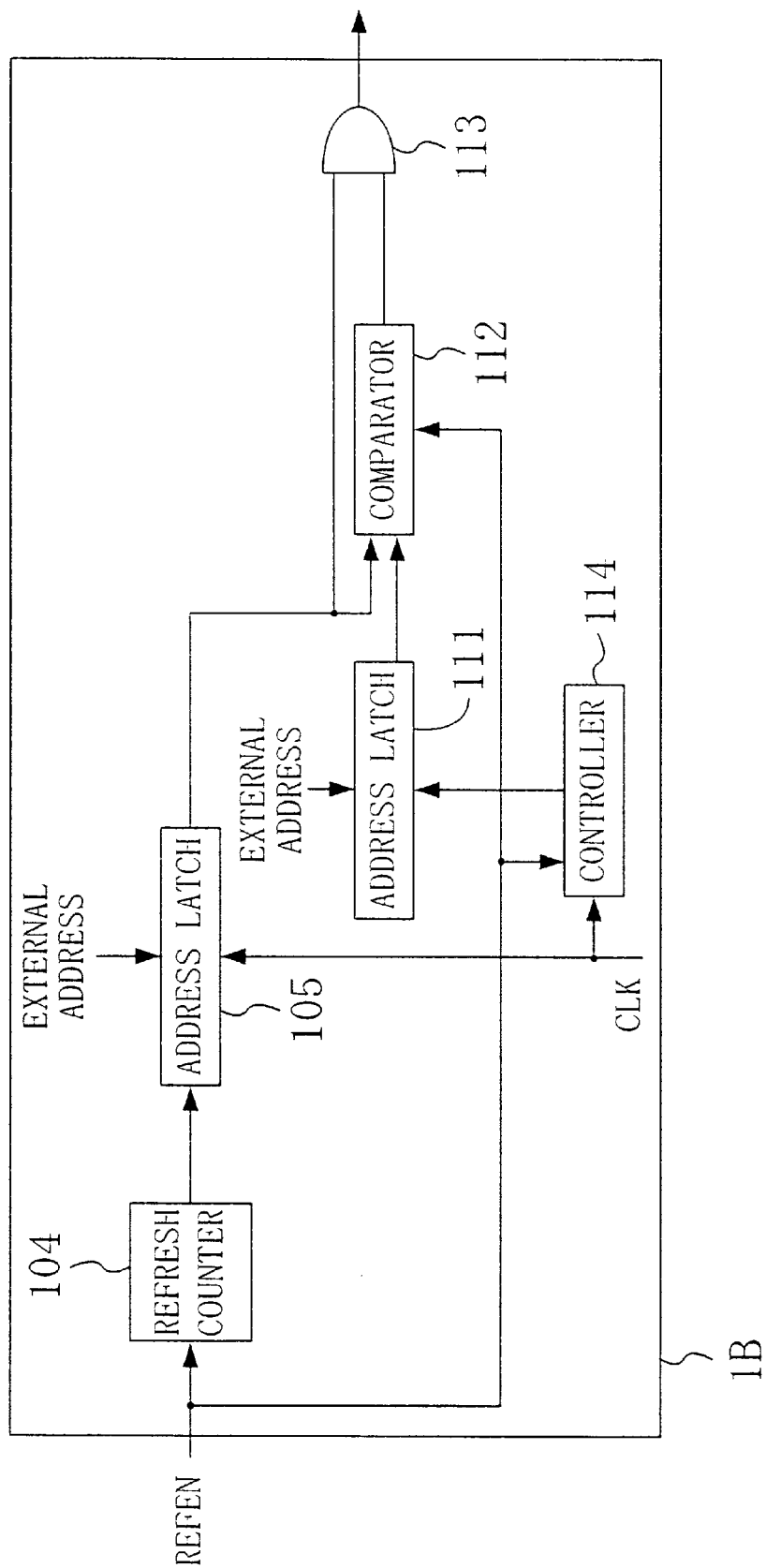
FIG. 9 is a block diagram illustrating a configuration for a main part of a semiconductor memory device according to a fourth embodiment of the present invention.

FIG. 9 illustrates the fourth embodiment of the present invention. The main part of the memory device of the fourth embodiment is almost the same as that illustrated in FIG. 1 except that the refresh controller 1 shown in FIG. 1 is replaced with a refresh controller 1B with a different internal configuration as shown in FIG. 9. As shown in FIG. 9, the refresh controller 1B includes refresh counter 104, address latches 105 and 111, comparator 112, AND gate 113 and controller 114. The address latch 105 latches an external or refresh address during normal and refresh operations. The address latch 111 latches an external address input during a normal operation. The comparator 112 compares the addresses latched in the address latches 105 and 111 to each other. In accordance with the information representing the results of comparison performed by the comparator 112, the AND gate 113 sends out a signal to the row decoder 104 shown in FIG. 1. Responsive to the external clock signal CLK, the controller 114 controls the latch operation by the address latch 111 while the refresh enable signal REFEN, output from the command controller 2, is asserted. In the embodiment shown in FIG. 9, just one address latch 105 is illustrated for convenience sake. Actually, though, the two signal paths are provided as shown in FIG. 7.

Figure 10:
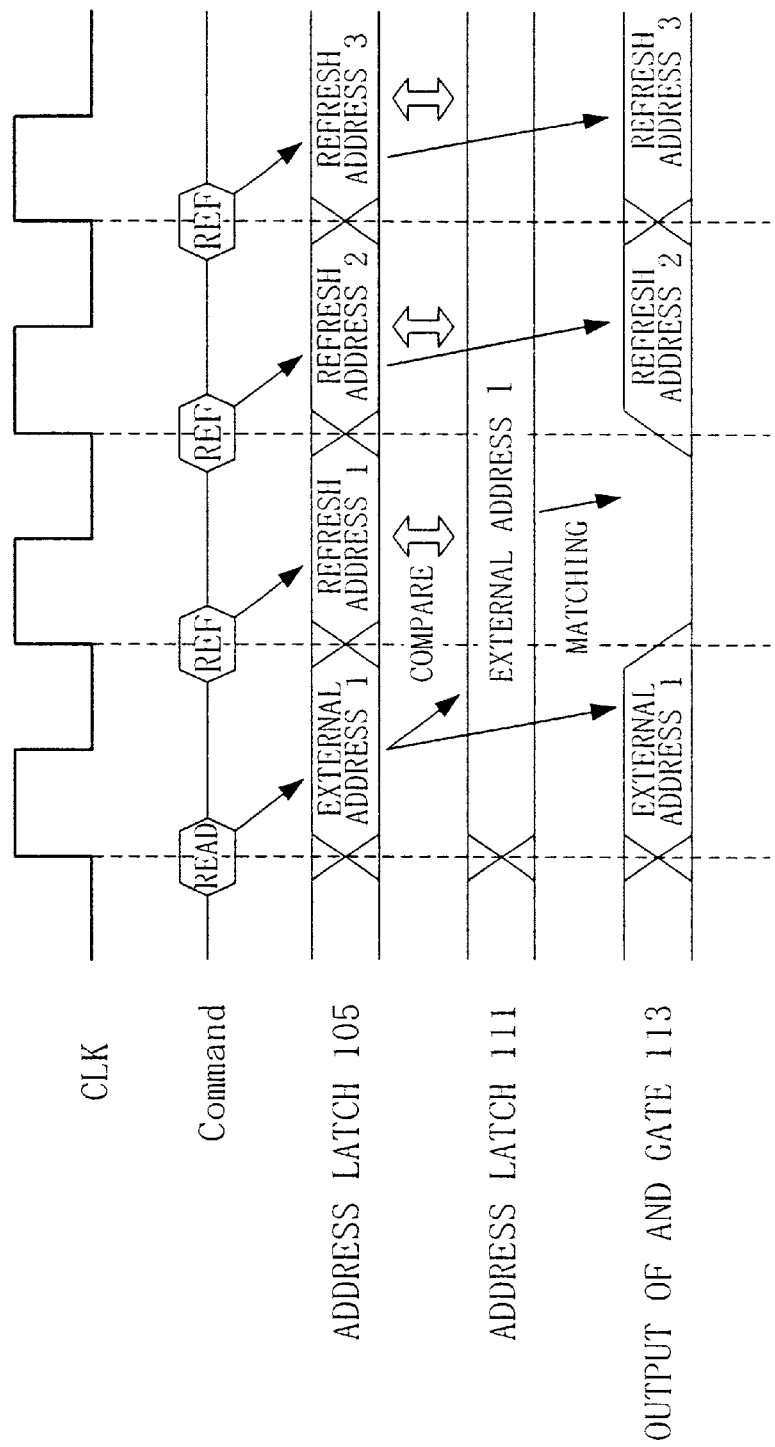
FIG. 10 is a timing diagram illustrating how the memory device of the fourth embodiment operates.

Hereinafter, it will be described with reference to the timing diagram illustrated in FIG. 10 how the memory device with such a configuration performs control over its refresh operations.

When refreshing is started, the command controller 2 generates the refresh enable signal REFEN. And the refresh counter 104 counts the number of times pulses of the refresh enable signal REFEN have been generated. In response, a refresh address, which has been output from the refresh counter 104, is latched in the address latch 105. In the meantime, the address latch 111 has latched therein an external address that has been input synchronously with the previous pulse of the external clock signal CLK.

Thereafter, the comparator 112 compares the external and refresh addresses to each other. If these two addresses are the same, then the AND gate 113 is deactivated to cancel the refresh operation. On the other hand, if the two addresses are different from each other, then the AND gate 113 is activated and the refresh address, latched in the address latch 105, is passed to the row decoder 4, thereby refreshing the memory cells specified by the refresh address. After the refresh operation has been performed in this way, a next refresh address is latched in the other address latch (not shown in FIG. 9) paired with the address latch 105. At this time, the previous external address is still latched in the address latch 111. Accordingly, even if the addresses were different in the previous cycle, the latched external address can be compared again to the new refresh address.

In the fourth embodiment, one external address latch 111 and one comparator 112 are provided. Alternatively, at least one more address latch 111 and at least one more comparator 112 of the types shown in FIG. 9 may be provided additionally. In that case, external addresses are sequentially latched in the address latches 111 during normal operations. Then, when refreshing is performed after that, each of the comparators 112 compares a given refresh address to an associated external address stored on one of the address latches 111. The refresh operation is also performed in the same way in this alternative embodiment.

As described above, every time refreshing is performed, a given refresh address is compared to an external address of a previously accessed memory cell. Thus, these addresses are much more likely to match to each other and the number of times of actual refreshing can be even smaller than the required number of times. Furthermore, by providing multiple address latches 111 and multiple comparators 112, the addresses can match to each other with even more certainty. An optimum number of address latches 111 or comparators 112 is determined depending on a combination of the specific application of the system and the chip area requirements.

Moreover, by combining the second and fourth embodiments together, the efficiency of refreshing can be further increased as in the third embodiment.

EMBODIMENT 5

Hereinafter, a fifth embodiment of the present invention will be described. The embodiment is a further modification to the fourth embodiment.

Figure 11:
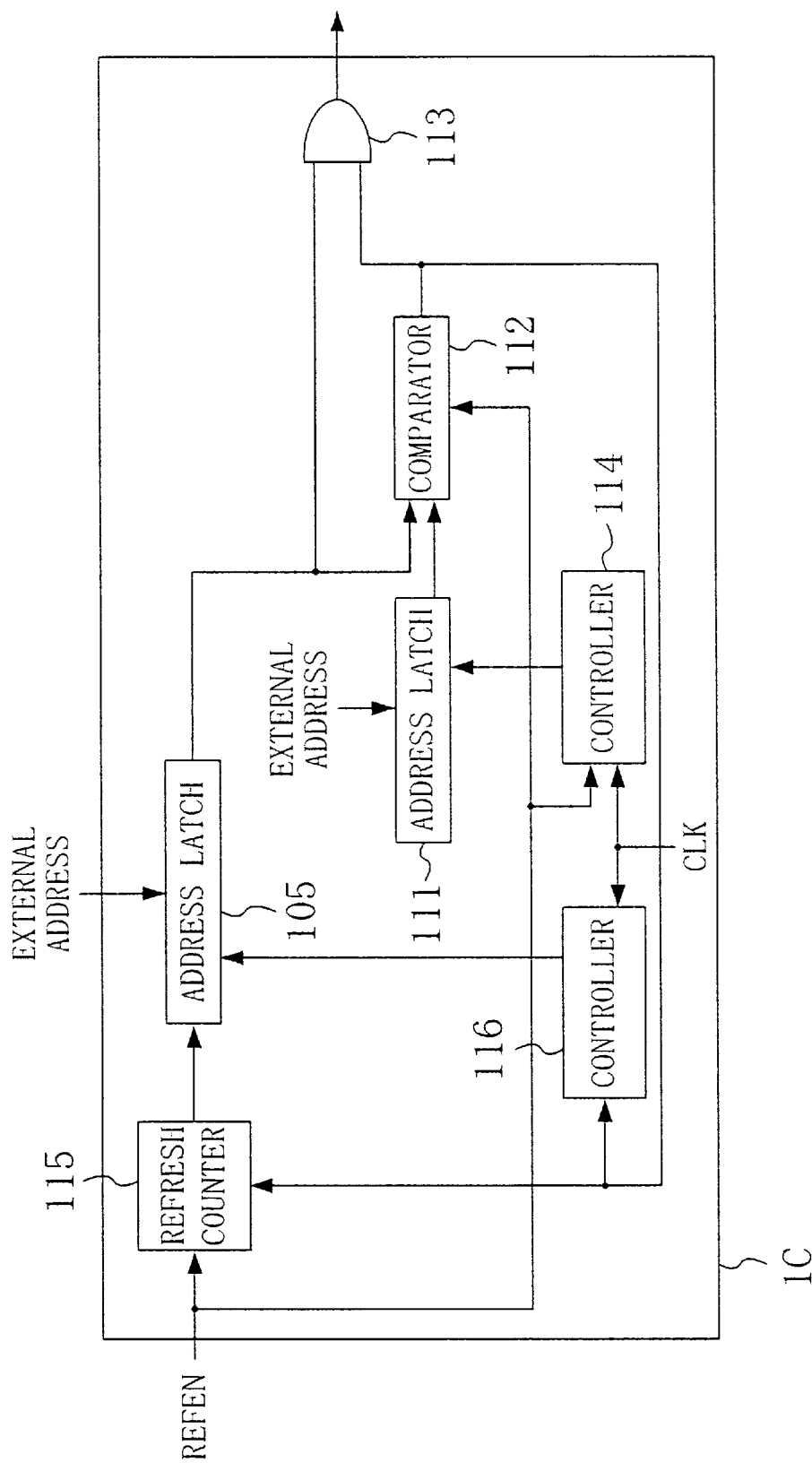
FIG. 11 is a block diagram illustrating a configuration for a main part of a semiconductor memory device according to a fifth embodiment of the present invention.

FIG. 11 is a block diagram illustrating an internal configuration for a refresh controller 1C, which is a modified version of the refresh controller 1B shown in FIG. 9, according to the fifth embodiment. As shown in FIG. 11, the refresh controller 1C includes refresh counter 115 that counts not only pulses of the refresh enable signal REFEN output from the command controller 2 but also those of the output signal of the comparator 112. The controller 1C further includes another controller 116, which makes the address latch 105 latch a new refresh address and thereby update the refresh address, on receiving the external clock signal CLK or the output signal of the comparator 112. The other components of the fifth embodiment are the same as the counterparts of the fourth embodiment, and the description thereof will be omitted herein.

Figure 12:
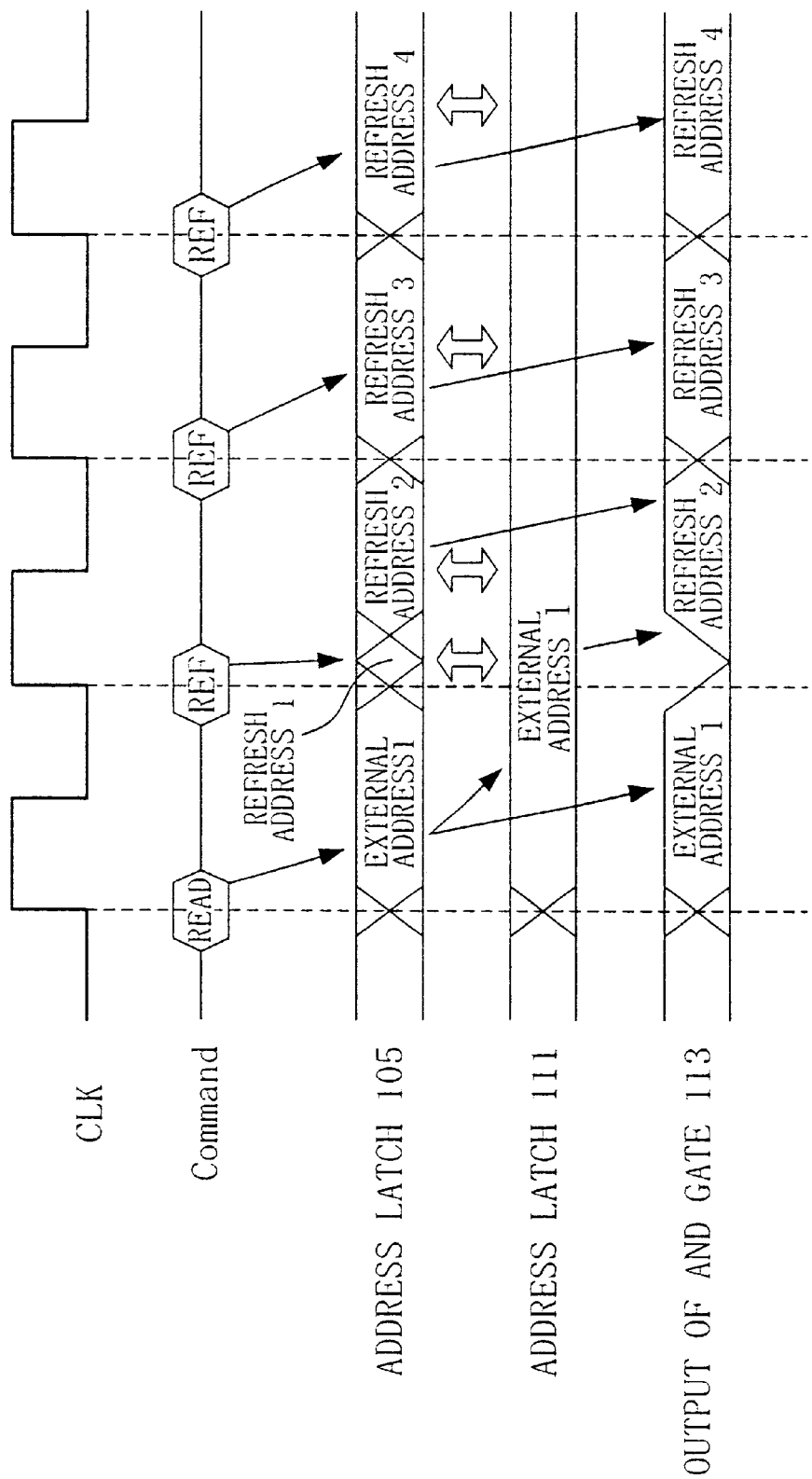
FIG. 12 is a timing diagram illustrating how the memory device of the fifth embodiment operates.

A semiconductor memory device with such a configuration performs controls over the refresh operations basically in the same way as the fourth embodiment. But the fifth embodiment is slightly different from the fourth embodiment in the following respects. Specifically, if a refresh address latched in the address latch 105 is the same as an external address latched in the address latch 111, then the refresh counter 115 increments its count by one responsive to the output signal of the comparator 112. And on receiving a control signal from the controller 116, the address latch 105 latches a next refresh address and the refresh operation is performed on memory cells specified by the new refresh address as shown in FIG. 12. In this case, since the address in the address latch 105 does not have to be compared to that latched in the address latch 111, the comparator 112 may be deactivated so that the refresh address is directly passed to the row decoder 4.

As can be seen, when the refresh address is found equal to the external address, refreshing is performed on memory cells specified by the next refresh address. Thus, refresh cycles can be made use of more fully. Also, by combining the fifth embodiment with the second embodiment, the efficiency of refreshing can be further increased.

EMBODIMENT 6

Hereinafter, a sixth embodiment of the present invention will be described. Like the third and fourth embodiments, the sixth embodiment also relates to a technique of reducing the number of times of refreshing to less than a normally required number.

Figure 13:
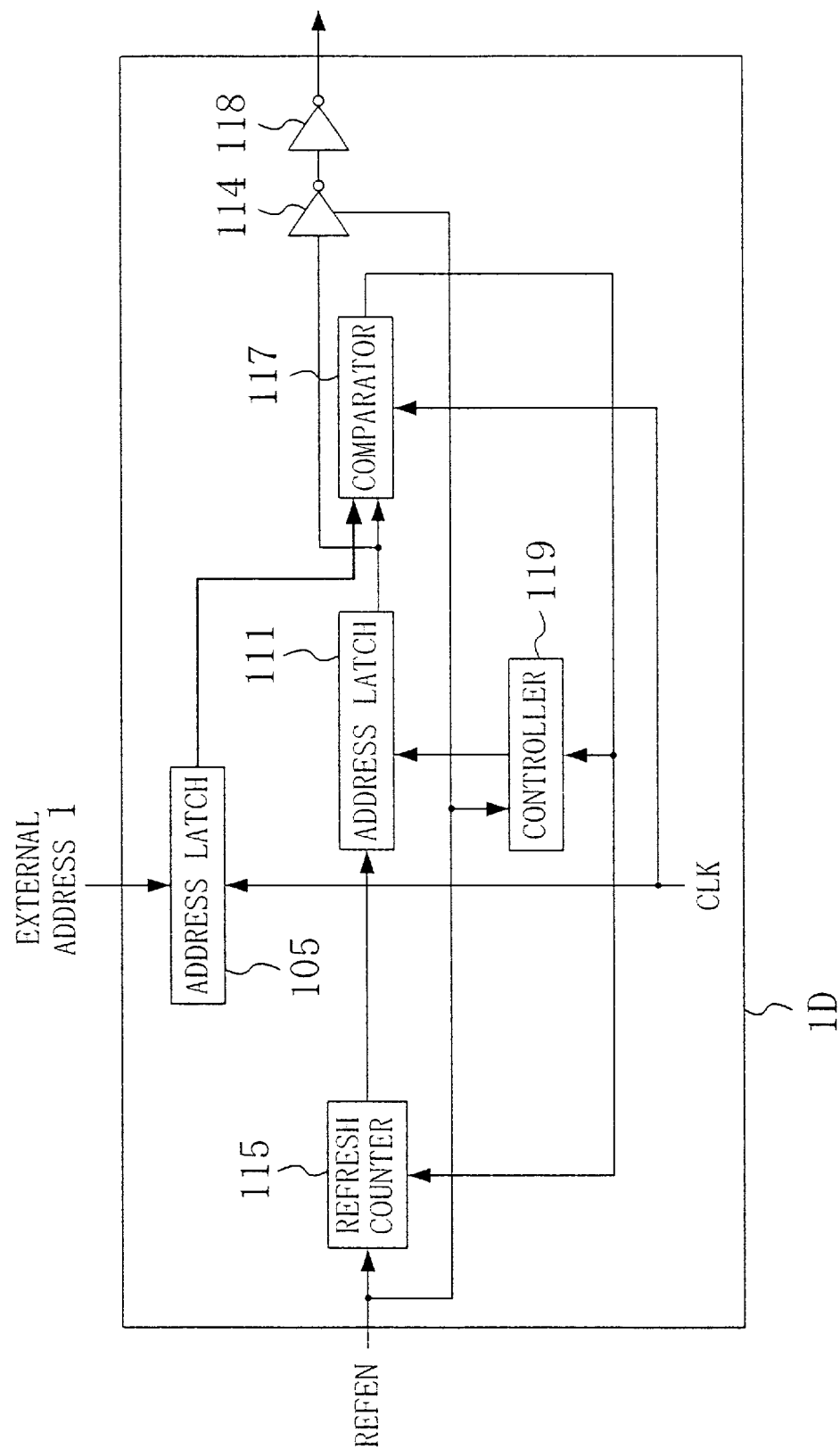
FIG. 13 is a block diagram illustrating a configuration for a main part of a semiconductor memory device according to a sixth embodiment of the present invention.

FIG. 13 is a block diagram illustrating an internal configuration for a refresh controller 1D, which is a modified version of the refresh controller 1C shown in FIG. 11, according to the sixth embodiment. As shown in FIG. 13, the refresh controller 1D includes refresh counter 115, address latches 105 and 111, tristate inverter 114, comparator 117, inverter 118 and controller 119. The refresh counter 115 counts not only pulses of the refresh enable signal REFEN but also those of the output signal of the comparator 117 representing a result of comparison. The address latch 105 latches an external address during a normal operation. The address latch 111 latches a refresh address during a refresh operation. The tristate inverter 114 is activated responsive to the refresh enable signal REFEN output from the command controller 2. The comparator 117 compares the external address latched in the address latch 105 to the refresh address latched in the address latch 111. The inverter 118 passes the refresh address latched in the address latch 111 to the row decoder 4 shown in FIG. 1. On receiving the refresh enable signal REFEN from the command controller 2 or the output signal of the comparator 117 representing the comparison result, the controller 119 generates a control signal to make the address latch 111 latch a new refresh address.

Hereinafter, it will be described how a semiconductor memory device with such a configuration performs a normal operation and a refresh operation.

In a normal operation, when an external command is input, an external address is latched in the address latch 105. If a refresh operation has just been performed, a new refresh address, next to the refresh address of the just refreshed memory cells, has already been latched in the address latch 111. Then, the comparator 117 compares the external address latched to the new refresh address latched. If these addresses are different, then the output signal of the comparator 117 representing the comparison result is negated. Alternatively, if these addresses are the same, then the output signal of the comparator 117 representing the comparison result is input to the refresh counter 115. As a result, a next refresh address is latched in the address latch 111.

In the same way, if an external address, which is input at the start of the next normal operation, is the same as the address latched in the address latch 111, then the refresh counter 115 also increments its count by one and a next refresh address is also latched in the address latch 111.

Thereafter, when a refresh operation is started, the refresh enable signal REFEN, output from the command controller 2, is asserted to activate the tristate inverter 114. As a result, the refresh address latched in the address latch 111 is passed to the row decoder 4 by way of the inverter 118. Then, when the next refresh operation is started, a refresh address, which is next to the address corresponding to the previous count of the refresh counter 115 during the previous refresh cycle, is passed to the row decoder 4 by way of the tristate inverter 114 and inverter 118.

As can be seen, if the external address of a memory cell that has been accessed during a normal operation is compared to a refresh address of memory cells to be refreshed next time, the external and refresh addresses are more likely to match to each other. Also, the sixth embodiment would be even more effective if the means for comparing a refresh address to an external address during refreshing as described for the third, fourth and fifth embodiments is combined with the sixth embodiment.

EMBODIMENT 7

Hereinafter, a seventh embodiment of the present invention will be described. In the seventh embodiment, refreshing is also performed by taking advantage of the window in which no external commands are input as in the first embodiment. The seventh embodiment also relates to a technique of performing the refresh operations intensively.

Figure 14:
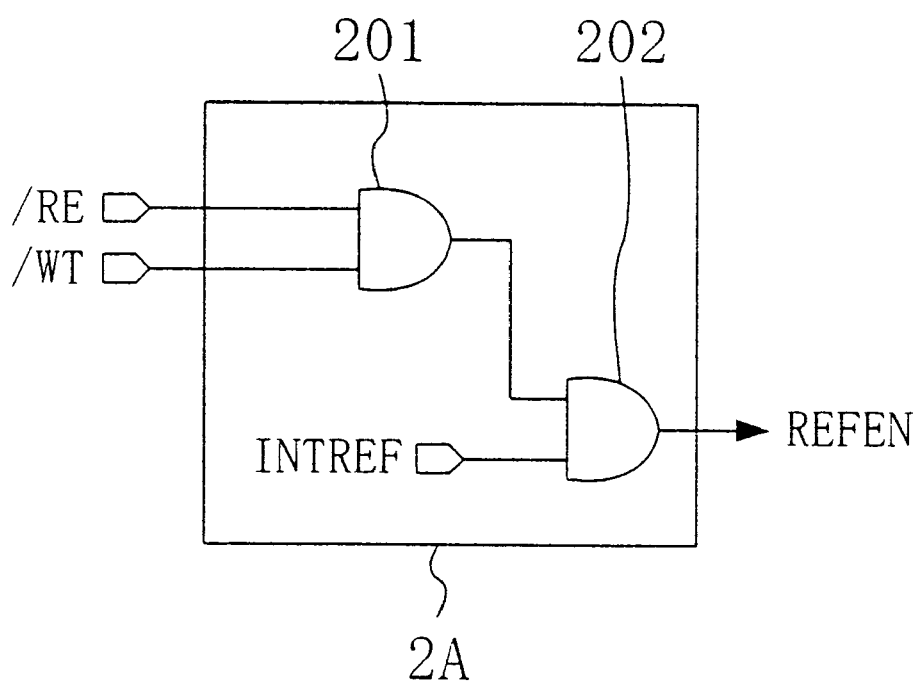
FIG. 14 is a block diagram illustrating a configuration for a main part of a semiconductor memory device according to a seventh embodiment of the present invention.

FIG. 14 illustrates the seventh embodiment. The overall configuration of a semiconductor memory device according to the seventh embodiment is similar to that illustrated in FIG. 1. However, in the seventh embodiment, the command controller 2 shown in FIG. 1 is replaced with the command controller 2A shown in FIG. 14. As shown in FIG. 14, the command controller 2A includes an AND gate 201, which is activated when an inverted signal /RE or /WT of an external read or write command is input. The controller 2A further includes another AND gate 202, which is activated responsive to an internal refresh signal INTREF and a high-level output of the AND gate 20. The internal refresh signal INTREF is provided to get the refresh operations carried out internally and independently.

During refreshing, it is not until the inverted signals /RE and /WT of the external commands are both input and the signal INTREF, getting the refresh operations done internally and independently, is asserted that the AND gate 202 generates the refresh enable signal REFEN. Then, the AND gate 202 passes the signal to the refresh controller 1 on the next stage so that the refresh operations will be performed.

The device of this embodiment includes unique refresh monitoring means for generating the internal refresh signal INTREF, getting the refresh operations done internally and independently, while no external commands are input. Accordingly, no matter how the system uses this memory device, refresh operations are performed a required minimum number of times automatically. As a result, the current is not consumed more than necessary. It should be noted that a detailed configuration of the refresh monitoring means will be described later.

In this embodiment, the command controller 2A is implemented as two AND gates 201 and 202. Alternatively, the command controller 2A is also implementable using any other logic circuits so long as the above function is executable.

Figure 15:
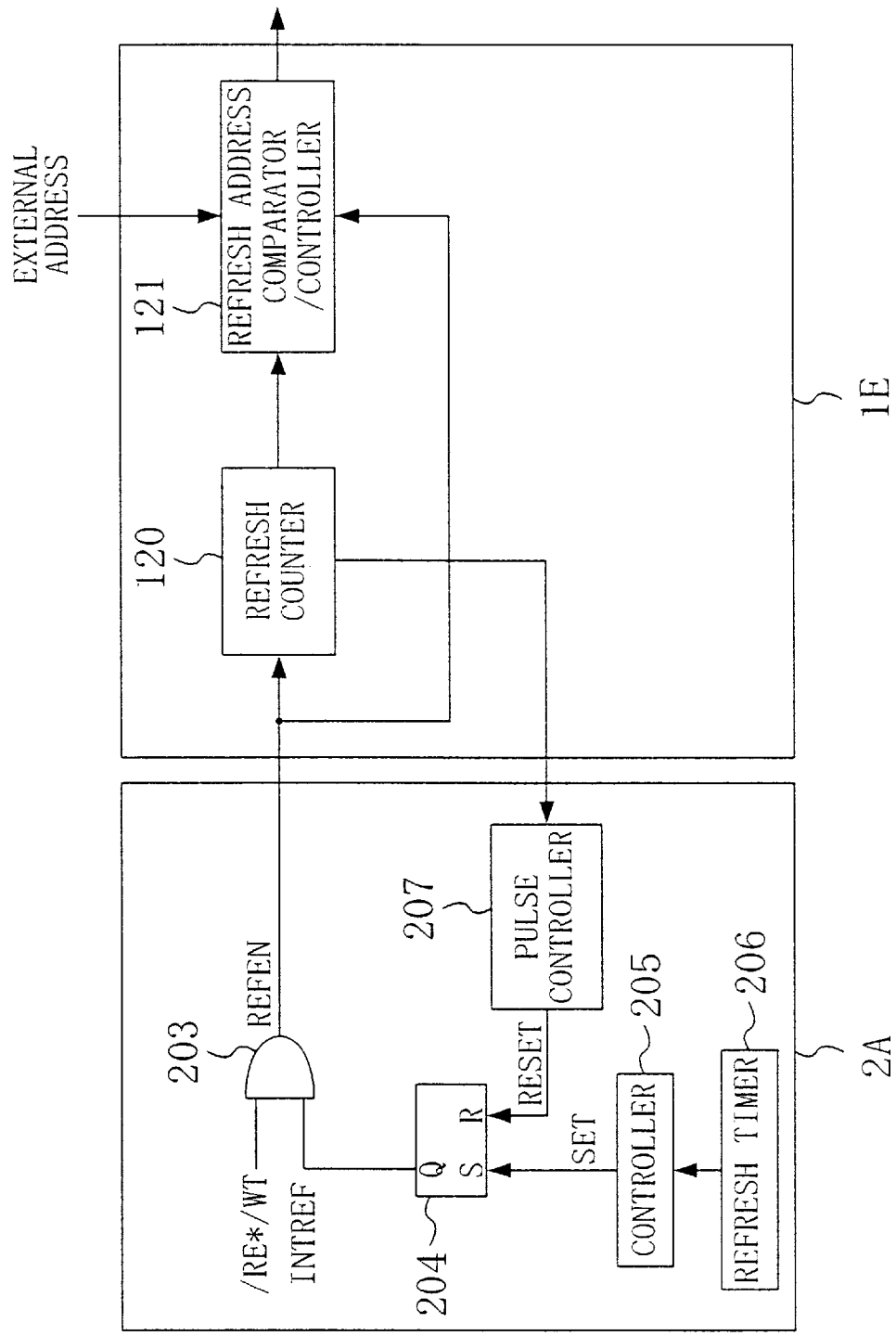
FIG. 15 illustrates exemplary internal configurations for the command controller and a refresh controller of the memory device of the seventh embodiment.

FIG. 15 illustrates a more specific configuration for the command controller 2A shown in FIG. 14 and an internal configuration for a refresh controller 1E. The other components of the memory device of the seventh embodiment are the same as the counterparts of the first embodiment.

As shown in FIG. 15, the command controller 2A includes refresh timer 206, controller 205, pulse controller 207, latch 204 and AND gate 203. The refresh timer 206 keeps a prescribed refresh cycle time. The controller 205 extracts only a start-of-cycle signal from the refresh timer 206 as a set signal SET. When a refresh counter 120, included in the refresh controller 1E, resets itself back to a count of zero (i.e., when a required number of times of refreshing is counted), the pulse controller 207 generates a pulse as a reset signal RESET. On receiving the set signal SET from the controller 205, the latch 204 asserts the internal refresh signal INTREF. On the other hand, responsive to the reset signal RESET from the pulse controller 207, the latch 204 negates the internal refresh signal INTREF. And the AND gate 203 outputs the refresh enable signal REFEN responsive to the high-level output of the AND gate 201 shown in FIG. 14 (i.e., /RE*/WT in FIG. 15) and the internal refresh signal INTREF output from the latch 204.

As shown in FIG. 15, the refresh controller 1E includes refresh counter 120 and refresh address comparator/controller 121. The refresh counter 120 counts the number of pulses of the refresh enable signal REFEN that has been output from the AND gate 203 of the command controller 2A. The information representing the count of the counter 120 is input to the pulse controller 207 of the command controller 2A. The refresh address comparator/controller 121 receives the refresh address, which has been output from the refresh counter 120, and an external address, compares these addresses to each other and cancels refreshing if these addresses are the same.

Figure 16:
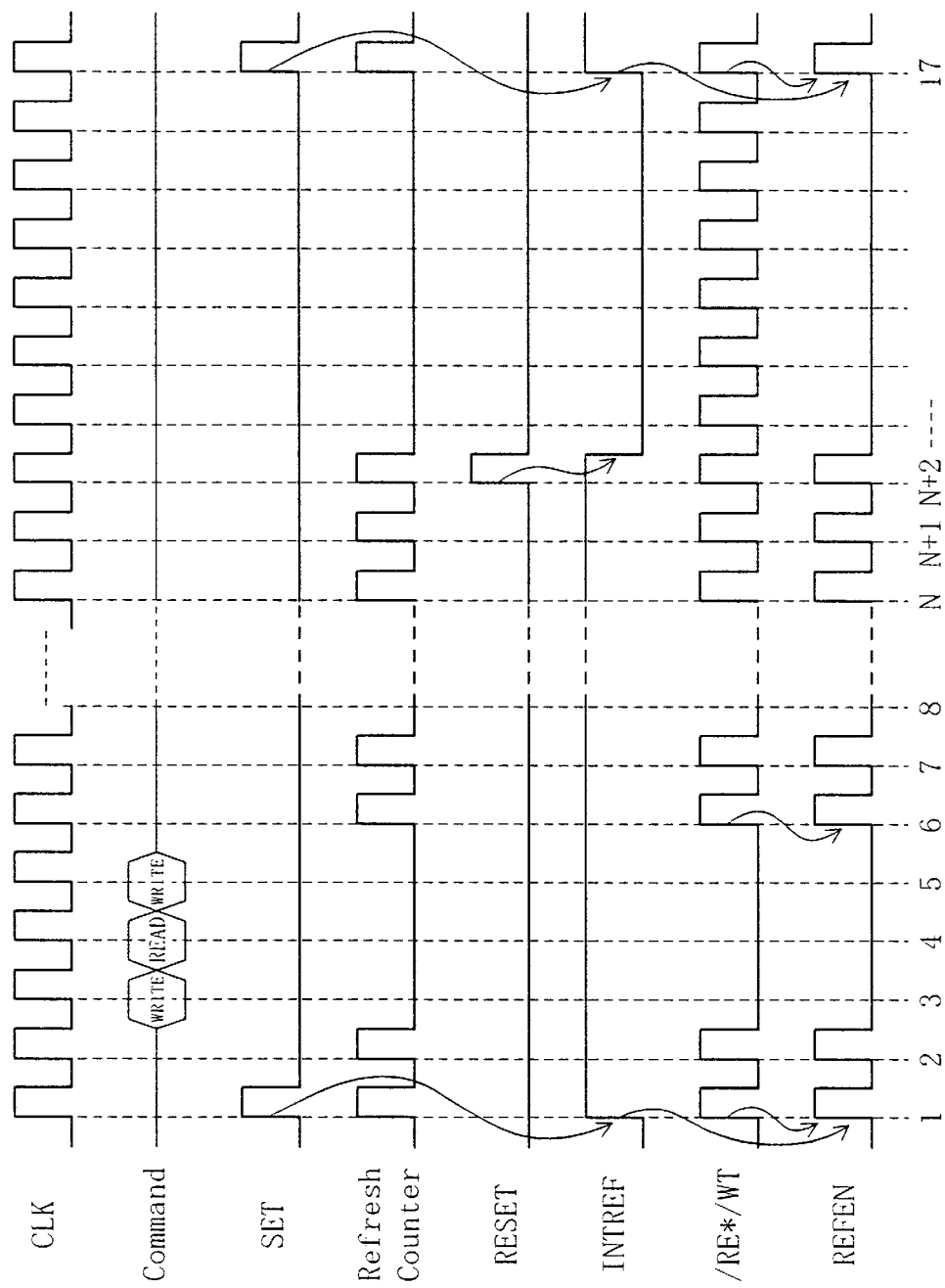
FIG. 16 is a timing diagram illustrating how the memory device of the seventh embodiment operates.

Hereinafter, it will be described with reference to FIG. 16 how a semiconductor memory device with such a configuration performs a normal operation and a refresh operation.

First, in Cycle 1 of the external clock signal CLK, the refresh timer 20 starts its timer operation. Then, responsive to the start-of-cycle signal output from the refresh timer 206, the controller 205 sends the set signal SET to the latch 204, thereby asserting the internal refresh signal INTREF. In this case, if the inverted signals /RE and /WT of the external commands have both been input to the AND gate 201, then the external command signal /RE*/WT is also asserted. These two signals, namely, the internal refresh signal INTREF and the external command signal /RE*/WT, together activates the AND gate 203, and therefore, the refresh enable signal REFEN is asserted. The pulse of the refresh enable signal REFEN is counted by the refresh counter 120, which output an associated refresh address to perform the refresh operation.

Next, in Cycle 2, the internal refresh signal INTREF is still logically high. Accordingly, the refresh counter 120 increments its count by one again. As a result, memory cells specified by the next refresh address are refreshed.

Subsequently, in Cycle 3, an external command WRITE is input and a write operation is performed. Accordingly, the external command signal /RE*/WT is negated. Although the internal refresh signal INTREF is still asserted, the refresh enable signal REFEN is negated so that refreshing is canceled. Then, external commands READ and WRITE are also input in the next two Cycles 4 and 5. Thus, refreshing is not performed, either.

Next, in Cycle 6, no external commands are input. Accordingly, the refresh operation is re-started, and in the following cycles (i.e., $6^{th}$ through $(N+1)^{th}$ cycles), the refresh counter 120 increments its count one by one and memory cells specified by the next refresh address are refreshed cycle after cycle.

Subsequently, in Cycle N+2, the refresh operation is also performed in the same way. But since the refresh counter 120 has reset itself back to a count of zero, the pulse controller 207 transmits the information as the reset signal RESET to the latch 204. As a result, the internal refresh signal INTREF is negated within this cycle.

Thereafter, in the next Cycle N+3, no external commands are input, either, but the internal refresh signal INTREF is still negated. Thus, the refresh enable signal REFEN is not generated and no refresh operation is performed. This state will continue until the next refresh cycle starts.

In Cycle 17, the next refresh cycle starts and the refresh timer 206 starts its timer operation again. And the control is performed in the same way as in Cycle 1.

In this manner, this embodiment provides means for monitoring refreshing internally and independently, which starts when the refresh timer 206 starts its operation and stops when the refresh counter 120 resets itself back to a count of zero (i.e., responsive to a signal indicating that all the memory cells have been refreshed successfully). Thus, the refresh operations have only to be performed a minimum required number of times. In addition, since the refresh timer 206 defines the refresh cycle, it is possible to avoid an unfavorable situation where the requirements of refreshing are not met. Furthermore, this is an easy-to-handle, effective means for the system, because the number of cycles to be interposed with no input of external commands should be no greater than the required number of times of refreshing according to the known requirements of refreshing. It should be noted that if any of the second, third, fourth, fifth and sixth embodiments is combined with the refresh address comparator/controller 121, the seventh embodiment would be even more effective.

EMBODIMENT 8

Hereinafter, an eighth embodiment of the present invention will be described. The eighth embodiment relates to a technique of reducing the power consumed by the operation of a refresh timer.

Figure 17:
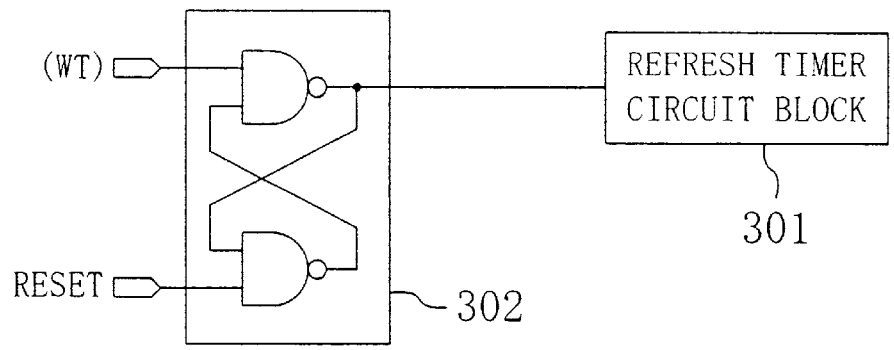
FIG. 17 is a block diagram illustrating a configuration for a main part of a semiconductor memory device according to an eighth embodiment of the present invention.

FIG. 17 is a block diagram illustrating a configuration for a main part of a semiconductor memory device of the eighth embodiment. As shown in FIG. 17, a refresh timer circuit block 301, including the refresh timer 206 shown in FIG. 15, for defining refresh cycles is connected to a latch 302 for generating a timer enable signal. The refresh timer circuit block 301 is not activated until the block 301 receives the timer enable signal. The latch 302 receives the RESET signal and an external command such as WRITE command (i.e., WT in FIG. 17) to generate the timer enable signal. It should be noted that the refresh timer circuit block 301 will also be used as a refresh timer 212 according to an eleventh embodiment illustrated in FIG. 23.

Figure 20:
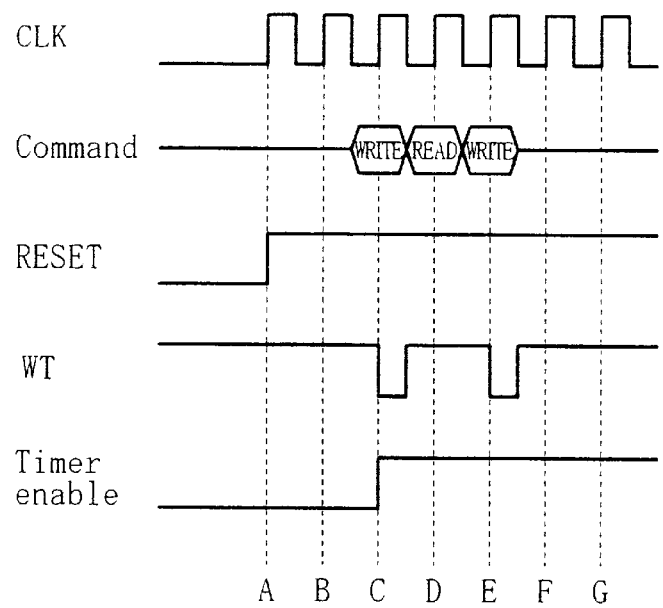
FIG. 20 is a timing diagram illustrating how the memory device of the eighth embodiment operates.

Next, it will be described with reference to FIG. 20 how the memory device of the eighth embodiment performs the refresh operations. As shown in FIG. 20, the latch 302 is activated responsive to the RESET signal in Cycle A of the external clock signal CLK. In the next Cycle B, no external commands are input and the latch 302 outputs no timer enable signals. Thereafter, in Cycle C, an external command WRITE is input, when the latch 302 latches this command WRITE and outputs the timer enable signal. As a result, the refresh timer circuit block 301 is activated and starts to operate at last. Once the external command has been latched, the timer enable signal will be kept logically high no matter whether or not external commands will be input in the succeeding Cycles D, E, F and G.

According to the eighth embodiment, it is not until an external command is input that the refresh timer circuit block 301 is activated and starts to operate. Accordingly, the refresh timer circuit block 301 can be suspended after the device has been powered and until the external command WRITE is input for the first time, i.e., while no data refreshing is needed. Thus, the power dissipation can be reduced.

It should be noted that the signal input to the latch 302 does not have to be the external command itself. Alternatively, a control signal corresponding to the external command may also be input instead.

EMBODIMENT 9

Hereinafter, a ninth embodiment of the present invention will be described with reference to FIG. 18. The ninth embodiment relates to a measure to be taken in a situation where refresh cycle times defined for refresh timers are unintentionally different among respective chips when refreshing is performed intensively.

Figure 18:
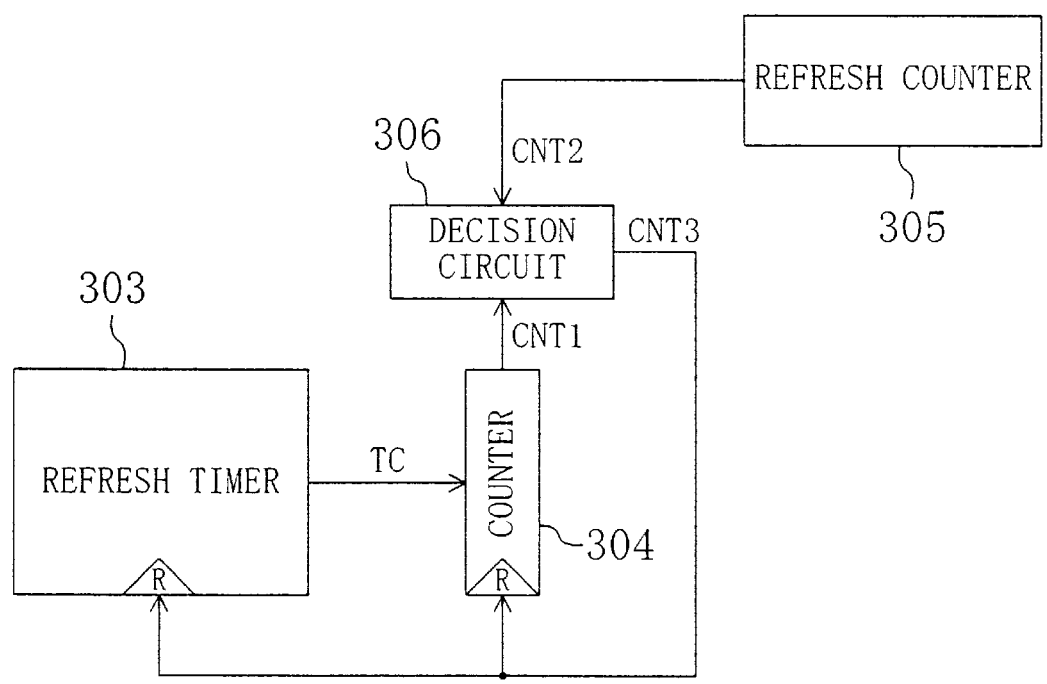
FIG. 18 is a block diagram illustrating a configuration for a main part of a semiconductor memory device according to a ninth embodiment of the present invention.

FIG. 18 is a block diagram illustrating a configuration for a main part of a semiconductor memory device according to the ninth embodiment. As shown in FIG. 18, the device includes refresh timer 303, counter 304, refresh counter 305 and decision circuit 306. The refresh timer 303 keeps a refresh cycle time and generates a signal TC every time the timer 303 has recorded one cycle time. Responsive to the signal TC indicating that the timer 303 has recorded one refresh cycle time, the counter 304 outputs a high-level count-up signal CT1. The refresh counter 305 counts the number of times the refresh operations have been performed. When the count of the counter 305 reaches a preset, required number of times, the refresh counter 305 outputs an end-of-counting signal CT2. The decision circuit 306 receives the output signal CNT1 of the counter 304 and the end-of-counting signal CTN2 output from the refresh counter 305. If the circuit 306 receives the end-of-counting signal CNT2 while the count-up signal CNT1 is being received (i.e., if the refresh timer 303 has recorded one refresh cycle time before the count of the refresh counter 305 reaches the required number of times), then the circuit 306 generates a signal CNT3, thereby resetting the refresh timer 303 and counter 304.

Figure 21:
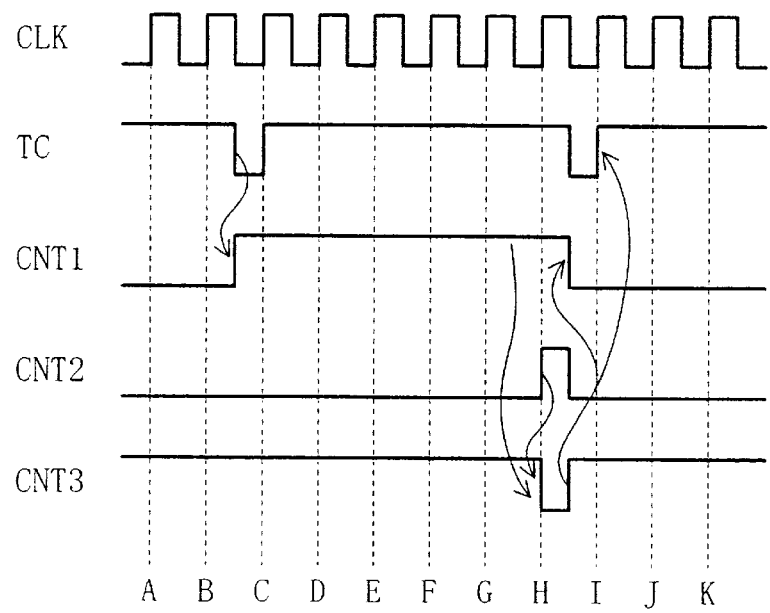
FIG. 21 is a timing diagram illustrating how the memory device of the ninth embodiment operates.

Next, it will be described with reference to FIG. 21 how the memory device of the ninth embodiment performs refresh operations. As shown in FIG. 21, when the refresh timer 303 records one refresh cycle time in Cycle B of the external clock signal CLK, the counter 304 generates the count-up signal CNT1 and keeps the signal asserted. And the decision circuit 306 receives the signal CNT1. At this point in time, the refresh counter 305 has not output the end-of-counting signal CNT2 yet, i.e., the refresh operations have not yet been performed a required number of times. In the next Cycle C, the refresh timer 303 starts keeping the next refresh cycle time and the signal TC is negated to the H level. Thereafter, in Cycle H, the refresh counter 305 outputs the end-of-counting signal CNT2 indicating that the refresh operations have been performed the required number of times. Since the decision circuit 306 receives the count-up signal CNT1 in Cycle B and then the end-of-counting signal CNT2 in Cycle H, the circuit 306 decides that the next refresh cycle has already started when the number of times of refreshing reaches the required number. Thus, the circuit 306 generates the signal CNT3, thereby resetting the refresh timer 303 and counter 304. Accordingly, after the refresh operations have been performed in Cycles C through H the required remaining number of times, the refresh timer 303 is newly set and the next refresh cycle starts in the next Cycle I.

Thus, according to this embodiment, even if the refresh cycle times of some of the refresh timers, included in respective chips, have become shorter than a prescribed cycle time, the refresh operations still can be performed at the prescribed cycle time the required number of times.

Accordingly, it is possible to avoid an unwanted situation where data is lost due to insufficient refreshing resulting from such a refresh cycle time shorter than the prescribed cycle time. Also, according to this embodiment, if the refresh operations have been performed the required number of times within the refresh cycle time of the refresh timer 303, no refreshing shall be performed, either, until the next refresh cycle starts.

EMBODIMENT 10

Hereinafter, a tenth embodiment of the present invention will be described with reference to FIG. 19. The tenth embodiment also relates to a measure to be taken in a situation where refresh cycle times defined for refresh timers are unintentionally different among respective chips as in the ninth embodiment. In addition, the tenth embodiment provides a technique of adjusting the refresh cycle time of a refresh timer to a point in time when the number of times of refreshing reaches the required number.

Figure 19:
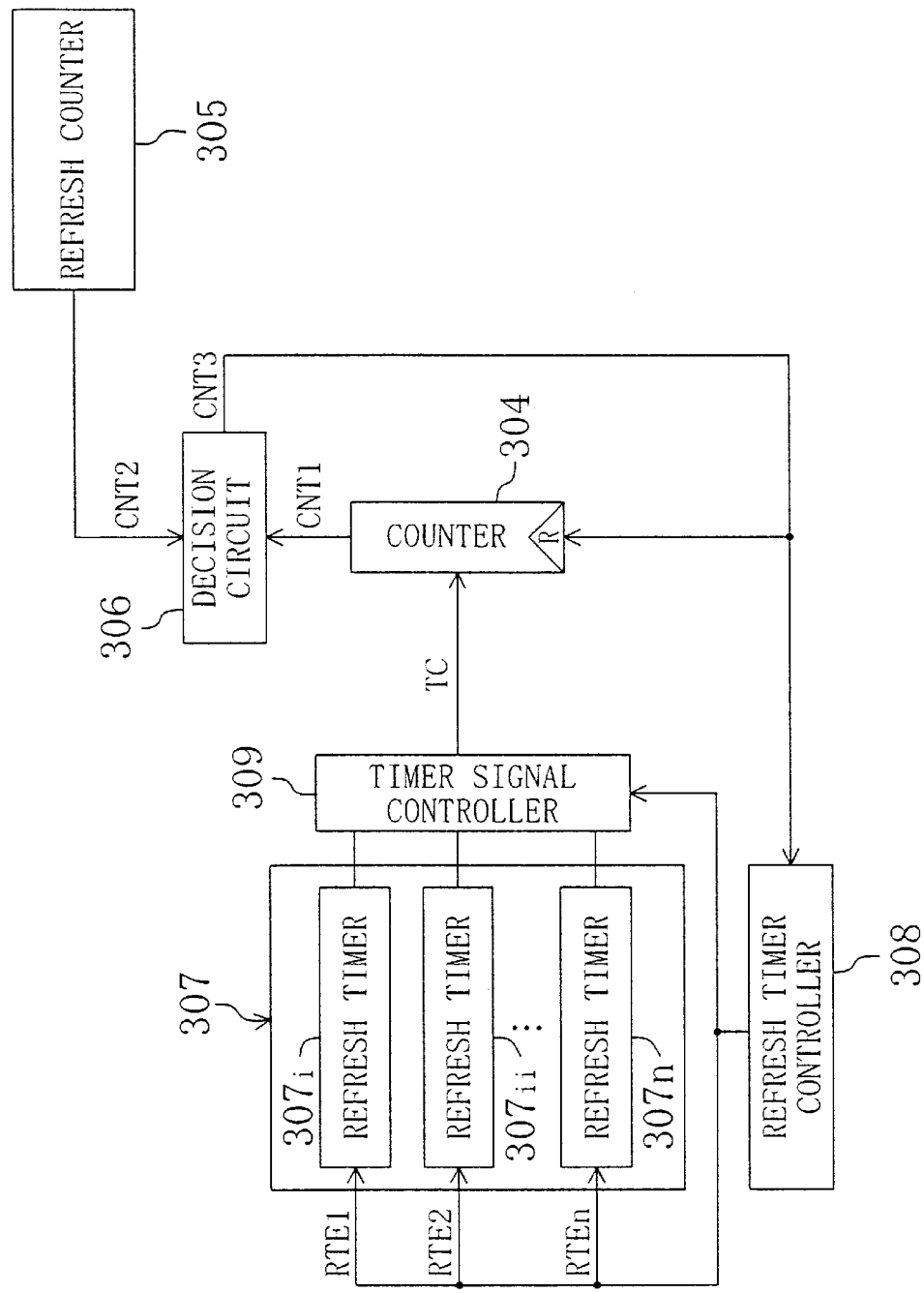
FIG. 19 is a block diagram illustrating a configuration for a main part of a semiconductor memory device according to a tenth embodiment of the present invention.

As shown in FIG. 19, the device includes counter 304, refresh counter 305, decision circuit 306, group 307 of refresh timers, refresh timer controller 308 and timer signal controller 309. The counter 304, refresh counter 305 and decision circuit 306 have the same constructions as the counterparts illustrated in FIG. 18. The group 307 consists of a number n of refresh timers 307i, 307ii, . . . and 307n with mutually different refresh cycle times. The refresh timer controller 308, which is exemplary cycle time changing means as defined in the claims, generates a select signal RTE1, RTE2, . . . or RTEn for selecting one of the timers 307i, 307ii, . . . and 307n responsive to the signal CNT3 received from the decision circuit 306. The timer signal controller 309 selectively passes only the output of the refresh timer 307i, 307ii, . . . or 307n, which has been selected by the refresh timer controller 308, as the signal TC to the counter 304.

Figure 22:
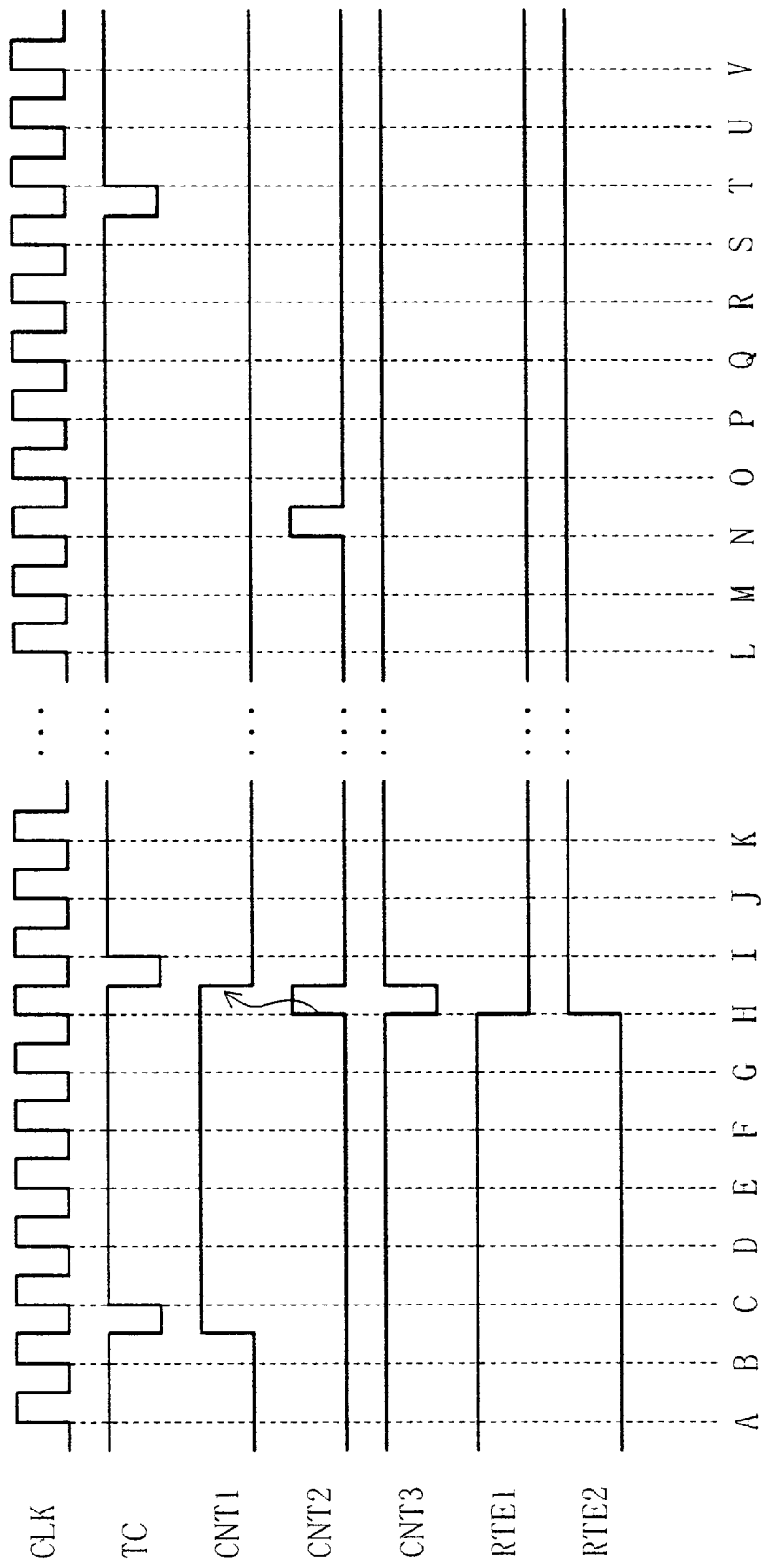
FIG. 22 is a timing diagram illustrating how the memory device of the tenth embodiment operates.

Next, it will be described with reference to FIG. 22 how the memory device of this embodiment performs refresh operations. In the following illustrative example, suppose the refresh timer controller 308 has generated the select signal RTE1 to select the refresh timer 307i.

As in the ninth embodiment, before the refresh counter 305 outputs the end-of-counting signal CNT2 in Cycle H of the external clock signal CLK to indicate that refreshing has been performed the required number of times, the refresh timer 307i has recorded one cycle time and output the signal TC in Cycle B. Thus, the refresh timer 307i has already started keeping the next refresh cycle time in Cycle C. When the end-of counting signal CNT2 is output in Cycle H, the decision circuit 306 outputs the signal CNT3, thereby resetting the counter 304. At this time, responsive to the signal CNT3, the refresh timer controller 308 changes its output signal from the control signal RTE1 into another control signal RTE2 to select the refresh timer 307ii with a cycle time longer than that of the refresh timer 307i. At the same time, the timer signal controller 309 also changes the timers selected from the timer 307i into the timer 307ii. Accordingly, after the next refresh cycle has started in Cycle I, the number of times of refreshing reaches the required number of times in Cycle N. And then the refresh timer 307ii records one refresh cycle time in Cycle S and outputs the signal TC. In this manner, the refresh operations can be performed the required number of times within one cycle time of the refresh timer 307ii. FIG. 22 illustrates an exemplary situation where an optimum refresh cycle time is defined with the refresh timer 307ii selected. However, if the refresh operations cannot be performed the required number of times within one cycle time of the refresh timer 307ii, then another refresh timer with the next longest cycle time will be selected.

Thus, according to this embodiment, if the cycle time of the refresh timer 307i is shorter than a prescribed refresh cycle time, then the refresh cycle time can be extended automatically. In this manner, an optimum refresh cycle time is ensured. Also, since the cycle time of a timer is changeable automatically, the power consumption of each chip can be further reduced independently by changing the refresh cycle time according to the period of time for which the memory can retain data.

In the tenth embodiment, multiple refresh timers with mutually different cycle times are provided. However, it is naturally possible to provide multiple frequency dividers for extending the cycle time of a single refresh timer by dividing its frequency.

EMBODIMENT 11

Hereinafter, an eleventh embodiment of the present invention will be described. In the eleventh embodiment, the refresh operations are also performed by taking advantage of the window during which no external commands are input as in the first embodiment. In addition, the eleventh embodiment also relates to a technique of performing the refresh operations discretely.

Figure 23:
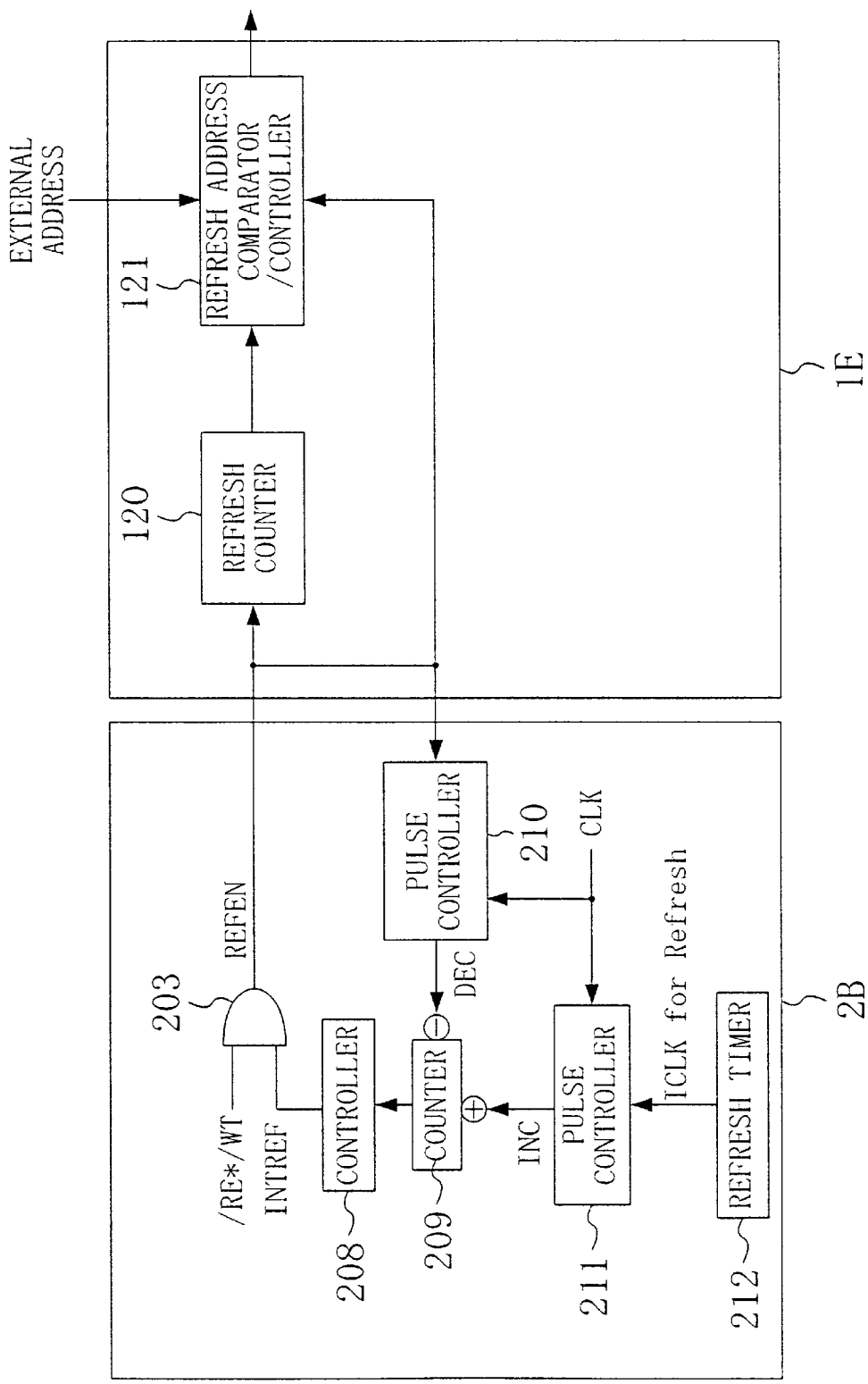
FIG. 23 is a block diagram illustrating a configuration for a main part of a semiconductor memory device according to an eleventh embodiment of the present invention.

FIG. 23 illustrates the eleventh embodiment of the present invention. The overall configuration of a semiconductor memory device according to the eleventh embodiment is similar to that illustrated in FIG. 1. However, in the eleventh embodiment, the refresh controller 1 and command controller 2 shown in FIG. 1 are replaced with the refresh controller 1E and command controller 2B shown in FIG. 23.

As shown in FIG. 23, the command controller 2B includes refresh timer 212, pulse controllers 210 and 211, up-down counter 209, controller 208 and AND gate 203. The refresh controller 1E is the same as the counterpart of the seventh embodiment illustrated in FIG. 15, and the description thereof will be omitted herein. The refresh timer 212 generates a refresh clock signal ICLK for Refresh. The pulse controller 211 is controlled responsive to the refresh clock signal ICLK for Refresh output from the refresh timer 212 and the external clock signal CLK. On receiving a pulse of the external clock signal CLK while the refresh clock signal ICLK for Refresh is high, the pulse controller 211 outputs a pulse as an increment signal INC synchronously with the leading edge of the pulse of the external clock signal CLK. The pulse controller 210 receives the refresh enable signal REFEN and the external clock signal CLK. On receiving a pulse of the external clock signal CLK while the controller 210 is receiving the refresh enable signal REFEN, the pulse controller 210 outputs a pulse as a decrement signal DEC synchronously with the trailing edge of the pulse of the external clock signal CLK. The up-down counter 209 increments its count by one responsive to the increment signal INC from the pulse controller 211 and decreases its count by one responsive to the decrement signal DEC from the pulse controller 210. And the controller 208 generates the internal refresh signal INTREF in accordance with the count of the counter 209.

Hereinafter, it will be described with reference to FIG. 24 how a semiconductor memory device with such a configuration performs normal and refresh operations.

First, in Cycle 1 of the external clock signal CLK, the refresh timer 212 generates the refresh clock signal ICLK for Refresh and starts to keep a predetermined refresh cycle time. Responsive to the refresh clock signal ICLK for Refresh and the external clock signal CLK, the pulse controller 211 outputs a pulse of the increment signal INC to the counter 209 synchronously with a leading edge of the external clock signal CLK. On receiving the pulse INC, the counter 209 increments its count to "1". And the controller 208 generates the internal refresh signal INTREF. In this cycle, however, an external command READ is being input. Accordingly, the refresh enable signal REFEN is not asserted and no refreshing is performed.

Next, in Cycle 2, the count of the counter 209 remains the same and the internal refresh signal INTREF is kept asserted. In this cycle, however, another external command WRITE is being input. Accordingly, the refresh enable signal REFEN is not asserted, either, and no refreshing is performed, either.

Subsequently, in Cycle 3, no external commands are input. Thus, the inverted signal /RE*/WT of the external commands is asserted and the AND gate 203 generates the refresh enable signal REFEN. As a result, a refresh operation is performed. In addition, the refresh enable signal REFEN is also input to the pulse controller 210 separately, which generates a pulse of the decrement signal DEC synchronously with a trailing edge of the external clock signal CLK. In response, the counter 209 decreases its count to zero, thereby negating the internal refresh signal INTREF.

Then, in Cycle 4, another external command READ is input and the internal refresh signal INTREF is still negated. Accordingly, no refreshing is performed. The following three Cycles 5, 6 and 7 are the same as Cycles 1, 2 and 3.

Thereafter, in Cycle 9, when the pulse controller 211 generates the signal INC that increments the counter 209, the internal refresh signal INTREF is generated. At this time, no external commands are input. Accordingly, the refresh enable signal REFEN is generated and a refresh operation is performed. In response, the pulse controller 210 generates the signal DEC that decrements the counter 209, thereby negating the internal refresh signal INTREF instantaneously. In the next two Cycles 10 and 11, no pulses of the increment signal INC are generated for the counter 209. Accordingly, no pulses of the internal refresh signal INTREF are generated, either, and no refresh operations are performed, either.

It should be noted that the counter 209 may be modified in various manners. For example, two upcounters may be used in place of the up-down counter 209. In that case, the internal refresh signal INTREF may be generated if the counts of these counters are different, and these counters may be reset by negating the internal refresh signal INTREF if the counts are equal to each other. Even by using such a configuration, the same operations as those described above can be performed.

As can be seen, this embodiment provides means for monitoring refreshing internally and independently. Specifically, if refreshing is performed once during one cycle of the refresh clock signal ICLK for Refresh of the refresh timer 212, then no refreshing will be performed again until the refresh clock cycle is over. Thus, the refresh operations are performed a minimum required number of times. In addition, since refreshing is performed just once during one cycle of the refresh clock signal ICLK for Refresh, the refresh operations will not be performed consecutively and the peak current can be dispersed. Furthermore, since the refresh clock signal ICLK for Refresh is defined, the requirements of refreshing can always be met.

It should be noted that by combining any of the foregoing second, third, fourth, fifth and sixth embodiments with the refresh address comparator/controller 121, this eleventh embodiment would be even more effective.

What is claimed is:

1. A semiconductor memory device comprising:
    an array of memory cells;
    command detecting means for detecting input or no input of an external command that requests access to one of the memory cells; and
    refreshing means for performing a refresh operation on associated one of the memory cells if the detecting means has detected no input of the command,
        wherein the memory cell is accessed synchronously with an external clock signal;
        the refreshing means performs the refresh operation synchronously with the external clock signal; and
        if a frequency of the external clock signal is equal to or lower than a frequency corresponding to a refresh cycle time, the refreshing means generates a refresh clock signal with a frequency higher than the frequency of the external clock signal and performs the refresh operation synchronously with a logical product of the refresh clock signal and the external clock signal.

2. A semiconductor memory device comprising:
    an array of memory cells:
    command detecting means for detecting input or no input of an external command that requests access to one of the memory cells; and
    refreshing means for performing a refresh operation on associated one of the memory cells if the detecting means has detected no input of the command,
    wherein the refreshing means comprises:
        an address latch for latching an external address that is input externally during a normal operation in which one of the memory cells is accessed; and
        a comparator for comparing a refresh address, which has been input during the refresh operation, to the external address that was latched in the address latch just before the refresh operation, and
            wherein if the refresh address matches to the external address, then the refreshing means cancels the refresh operation on one of the memory cells that is specified by the refresh address.

3. The device of claim 2, further comprising at least one additional address latch and at least one additional comparator that perform the same functions as the address latch and the comparator, respectively,
    wherein the refresh address is compared to the external address latched in each said address latch during the refresh operation.

4. The device of claim 2, wherein if the refresh address matches to the external address latched in the address latch, the refreshing means updates the refresh address.

5. A semiconductor memory device comprising:
    an array of memory cells;
    command detecting means for detecting input or no input of an external command that requests access to one of the memory cells; and
    refreshing means for performing a refresh operation on associated one of the memory cells if the detecting means has detected no input of the command,
        wherein the refreshing means comprises a comparator for comparing an external address to a refresh address during a normal operation in which one of the memory cells is accessed, and wherein if the refresh address matches to the external address, the refreshing means updates the refresh address.

6. A semiconductor memory device comprising:

an array of memory cells;

a logic circuit for generating a refresh enable signal responsive to an external command and an internal refresh signal, the logic circuit generating the refresh enable signal when an external command requesting memory access is not input and the internal refresh signal is asserted;

a refresh timer circuit for keeping a refresh cycle time;

a refresh controller for performing a refresh operation on the array of memory cells responsive to the refresh enable signal, the refresh controller including a refresh counter for counting pulses of the refresh enable signal; and a latch circuit for generating the internal refresh signal, the latch circuit being set upon receipt of a set signal indicating the start of a refresh cycle according to the refresh timer circuit, and the latch circuit being reset upon receipt of a reset signal generated according to a count of the refresh counter.

7. The device of claim 6, wherein the refresh counter is reset when all the memory cells of the array of memory cells are refreshed and the reset signal is generated when the refresh counter is reset.

8. The device of claim 6, wherein the refresh timer circuit is enabled in response to an external command after the device has been powered.

9. The device of claim 6, further comprising:

a counter coupled to the refresh timer circuit for counting refresh cycles; and a decision circuit for resetting the refresh timer circuit and the counter when the counter outputs a count-up signal indicating that the refresh timer circuit has recorded one refresh cycle time and the refresh counter outputs an end-of-counting signal.

10. The device of claim 9, further comprising:

cycle time changing means coupled to the decision circuit for changing refresh cycle time;

wherein the refresh timer circuit comprises a plurality of refresh timers with mutually different cycle times and the cycle time changing means generates a select signal to select one of the plurality of refresh timers.

* * * * *

UNITED STATES PATENT AND TRADEMARK OFFICE
CERTIFICATE OF CORRECTION

PATENT NO.    : 6,327,210 B1
DATED         : December 4, 2001
INVENTOR(S)   : Naoki Kuroda et al.

It is certified that error appears in the above-identified patent and that said Letters Patent is hereby corrected as shown below:

<u>Title page,</u>
Item [75], Inventors, change "Naoki Kuroda, Osaka JP" to -- Naoki Kuroda, Kyoto, JP --

Signed and Sealed this

Ninth Day of April, 2002

Attest:

Attesting Officer

JAMES E. ROGAN
*Director of the United States Patent and Trademark Office*